(12) United States Patent
Boesch et al.

(10) Patent No.: US 9,368,749 B2
(45) Date of Patent: Jun. 14, 2016

(54) PATTERNED MULTILAYERED STACK, AND SYSTEM AND METHOD FOR MAKING THE SAME

(71) Applicant: CHEIL INDUSTRIES INC., Uiwang-si, Gyeonggi-do (KR)

(72) Inventors: Damien S. Boesch, Uiwang-si (KR); Lorenza Moro, Uiwang-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 129 days.

(21) Appl. No.: 14/175,890

(22) Filed: Feb. 7, 2014

(65) Prior Publication Data
US 2014/0272254 A1    Sep. 18, 2014

Related U.S. Application Data

(60) Provisional application No. 61/777,292, filed on Mar. 12, 2013.

(51) Int. Cl.
*H01L 51/52* (2006.01)

(52) U.S. Cl.
CPC ......... *H01L 51/5256* (2013.01); *Y10T 428/234* (2015.01); *Y10T 428/239* (2015.01)

(58) Field of Classification Search
CPC .................. H01L 51/5256; Y10T 428/234
USPC .......................................................... 428/72
See application file for complete search history.

(56) References Cited

U.S. PATENT DOCUMENTS

2002/0140347 A1   10/2002   Weaver
2003/0064171 A1   4/2003   Burrows et al.
2006/0145606 A1 * 7/2006   Lee ............ H01L 27/3276
                                                       313/509
2009/0191342 A1   7/2009   Chu et al.
2009/0208754 A1   8/2009   Chu et al.
2010/0167002 A1   7/2010   Chu et al.

(Continued)

FOREIGN PATENT DOCUMENTS

KR   10-2012-0046427   5/2012
WO   WO 2004/112165 A1   12/2004
WO   WO 2008/094352 A1   8/2008

OTHER PUBLICATIONS

Zambov et al., "Advanced Roll-to-Roll Plasma-Enhanced CVD Silicon Carbide Barrier Technology for Protection from Detrimental Gases," Chem. Vap. Deposition, 17:253-260, 2011.

(Continued)

*Primary Examiner* — Brent O'Hern
(74) *Attorney, Agent, or Firm* — Lewis Roca Rothgerber Christie LLP

(57) ABSTRACT

A patterned multilayered barrier film for protecting devices from permeation of moisture and gases includes a substrate, a first layer on the substrate acting as a barrier layer, a second layer on the first layer and acting as a decoupling or planarization layer, and a third layer on the second layer, and acting as a barrier layer. Each of the first and third layers has an area greater than an area of the second layer such that the second layer is completely enclosed between the first and third layers defining an edge perimeter surrounding the second layer that is completely sealed between the first and third layers. The patterned multilayered barrier film may be cut into individual barrier units between portions of the second layer such that portions of the second layer of each individual barrier unit are completely edge-sealed between the first and third layers.

11 Claims, 16 Drawing Sheets

(56) References Cited

U.S. PATENT DOCUMENTS

2010/0187986 A1 7/2010 Kajitani et al.
2010/0196679 A1 8/2010 Morishima

OTHER PUBLICATIONS

Zambov et al., "Advanced chemical vapor deposition silicon carbide barrier technology for ultralow permeability applications", J. Vac. Sci. Technol. A, 24(5), 1706-1713, 2006.

* cited by examiner

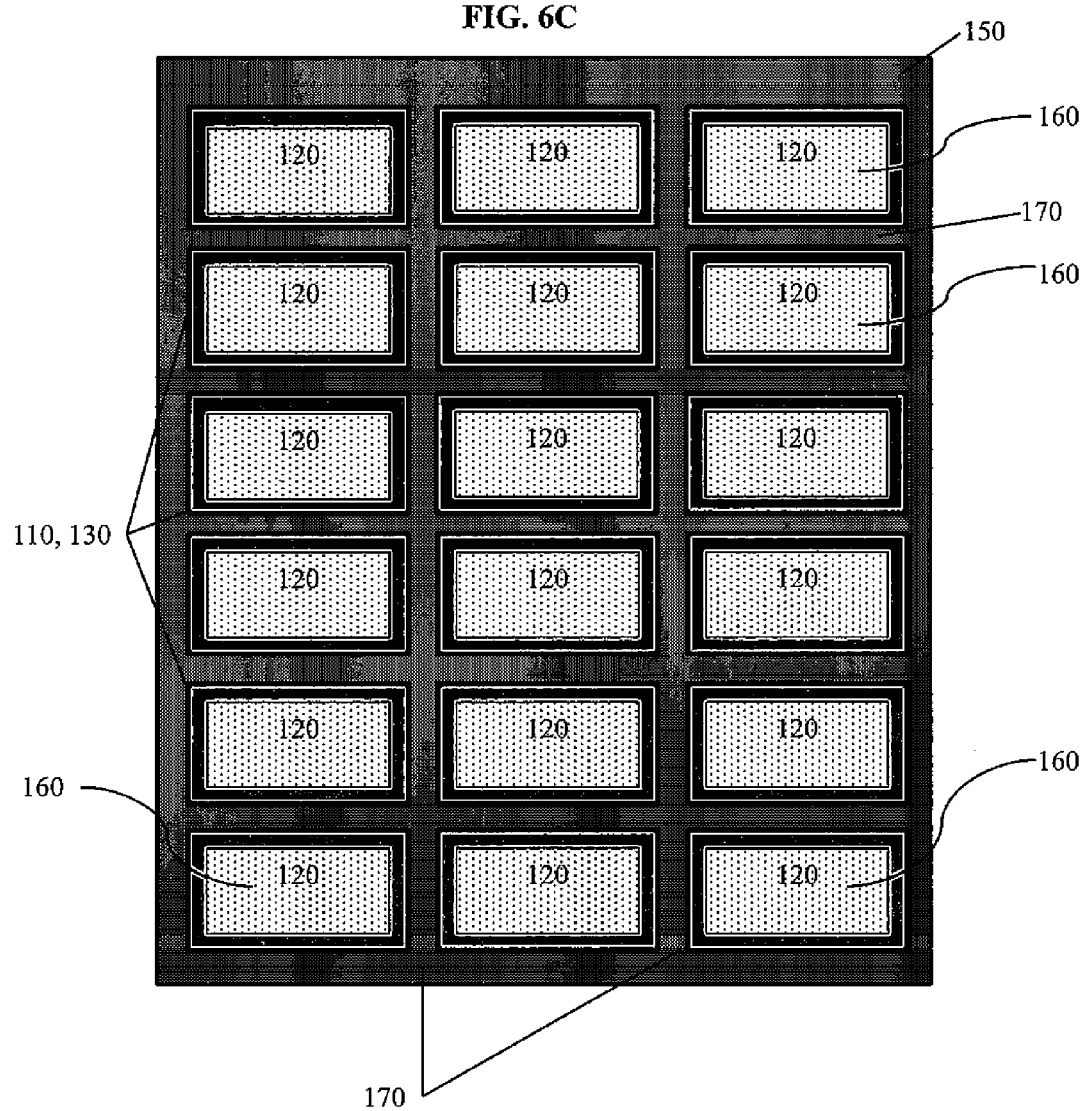

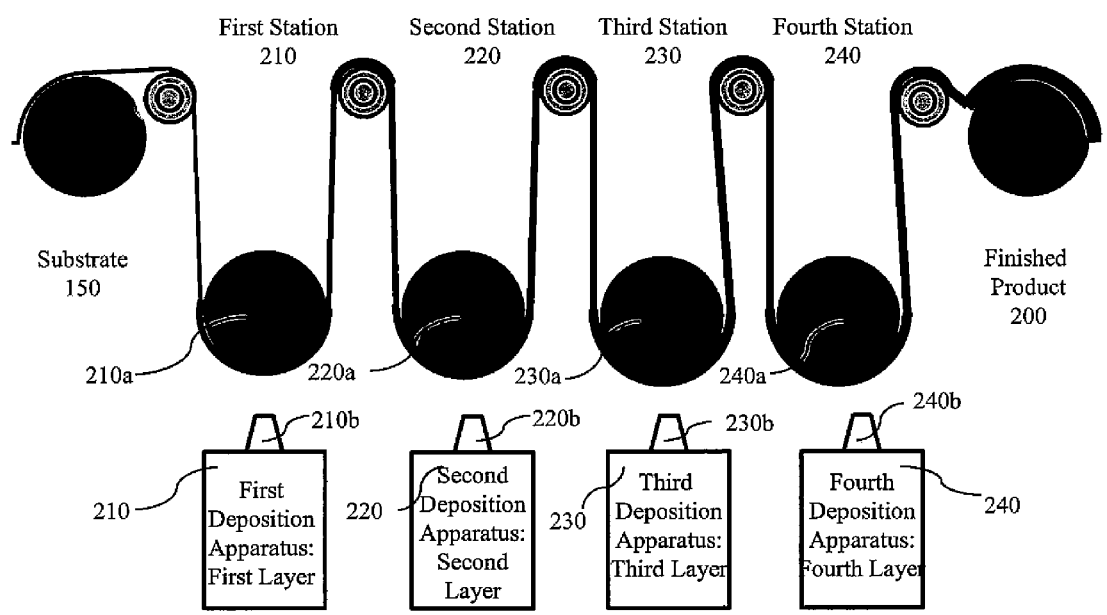

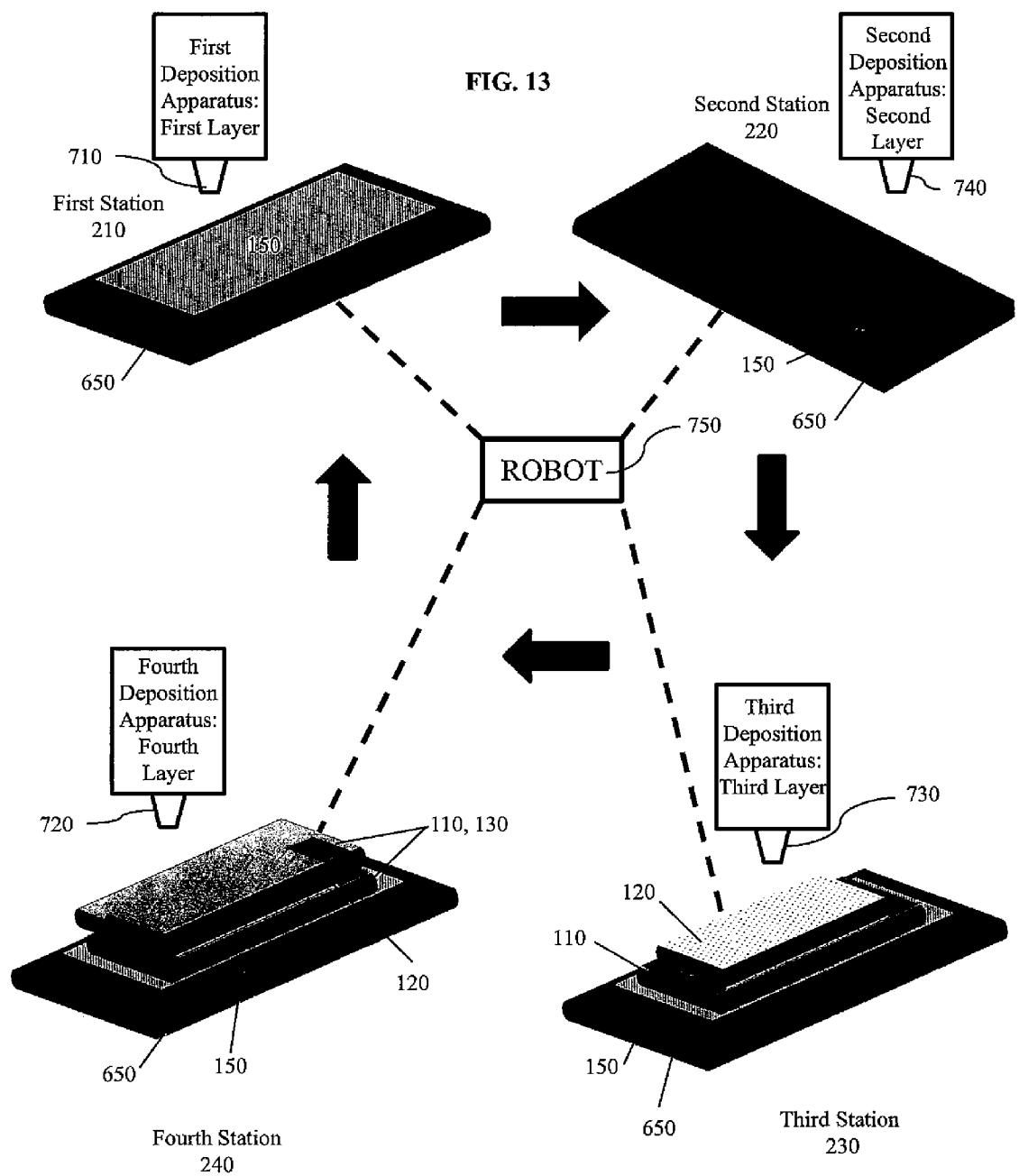

PATTERNED MULTILAYERED STACK, AND SYSTEM AND METHOD FOR MAKING THE SAME

CROSS-REFERENCE TO RELATED APPLICATION(S)

This application claims priority to and the benefit of U.S. Provisional Application No. 61/777,292 filed Mar. 12, 2013, entitled PATTERNED MULTILAYERED STACK, AND SYSTEM AND METHOD FOR MAKING THE SAME, the entire contents of which is incorporated herein by reference.

TECHNICAL FIELD

The present disclosure is related to patterned multilayered stacks for protecting devices from permeation of moisture and gases, and to systems and methods of making the patterned multilayered stacks.

INTRODUCTION

Many devices, such as organic light emitting devices (OLEDs) and the like, are particularly vulnerable to degradation from the permeation of certain liquids and gases such as water vapor and oxygen present in the environment, and other chemicals that may be used during the manufacture, handling, or storage of the product. To reduce permeability to these damaging liquids, gases, and chemicals, the devices are typically coated with a barrier coating, or encapsulated by incorporating a multilayer barrier film adjacent to one or both sides of the device.

Barrier coatings typically include a single layer of inorganic material, such as aluminum, silicon or aluminum oxides, or silicon nitrides. Multilayer barrier films generally include at least one barrier layer, and at least one decoupling layer, and can be deposited directly on the device to be protected, or may be deposited on a separate film or support, and then laminated onto the device. The decoupling layer(s) and barrier layer(s) of multilayer barrier films can be deposited by any of various techniques (e.g., vacuum deposition processes or atmospheric processes).

For many devices, however, both single layer barrier coatings and multilayer barrier films may be insufficient for reducing or preventing oxygen or water vapor permeability at all surfaces. Indeed, in OLEDs, for example, which require exceedingly low oxygen and water vapor transmission rates, single layer barrier coatings often do not adequately reduce or prevent the permeability of damaging gases, liquids, and chemicals. Accordingly, in those devices (e.g., OLEDs and the like), multilayer barrier films have been used in an effort to further reduce or prevent the permeation of damaging gases, liquids, and chemicals.

Similarly, when multilayer barrier films are deposited either directly onto a device to be protected, such as an OLED or the like, or on a separate film or support and then laminated onto the device to be protected, the edges of the decoupling layer(s) are often exposed, making them vulnerable to permeation of certain liquids and gases such as water vapor and oxygen present in the environment, and other chemicals that may be used during the manufacture, handling, or storage of the product. Penetration of certain liquids and gases to the decoupling layer(s) leads to quicker saturation of the decoupling layer(s), and shorter lag time to reach steady-state flux, thus diminishing the operational life of the multilayer barrier film. This problem arises typically when the decoupling layer(s) are deposited over the entire surface of the device, or when a separate film or support containing the decoupling layer(s) is laminated onto the device to be protected. A similar exposed edge permeation problem often occurs when a bulk multilayer barrier film (e.g., a large composite film made in a large sheet or roll form) is cut to size to create individual encapsulation units for separate lamination onto each device to be protected.

Several methods for remedying the problems associated with exposed edges of barrier film layers have been proposed. One such method proposes encapsulating a device using a discrete sheet barrier film manufactured specifically for direct encapsulation of the target device to be protected. In this discrete sheet barrier film, the polymeric decoupling layers are completely covered by inorganic layers and have no exposed edges. However, this method requires individual manufacturing of a sheet for each specific device in order to ensure an edge seal of the decoupling layer, thereby requiring significant processing and manufacturing costs associated with the individual production of a specific discrete sheet for each device to be protected. More practical, bulk processing techniques, such as roll-to-roll (R2R) processing or other bulk sheet based processing techniques, are not feasible with this method, as those processing techniques would require cutting the larger bulk sheet to an appropriate size to fit the specific device. The cutting of the large bulk sheet using this method would, thus, result in the decoupling layer having exposed edges, thereby destroying the edge seal around the decoupling layer.

Another alternative method proposes encapsulating a device between two substrates, sealing the two substrates together with an exposed adhesive that must then be covered with a single barrier layer or an additional barrier stack. However, when a single barrier layer is deposited adjacent to the exposed adhesive, the single barrier layer often does not adequately reduce or prevent the permeation of damaging gases, liquids, and chemicals, as discussed above. Similarly, when a barrier stack is deposited adjacent to the exposed adhesive, any exposed portion of the decoupling or polymer layer at the edges of the barrier stack may encounter the same permeation problems as described above. Furthermore, use of a barrier layer or stack adjacent to the exposed adhesive typically creates a step or bulge at the substrate surface. In some instances, such a gap or bulge at the surface can cause degradation in light extraction efficiency and make it difficult to implement a touch screen for the protected device, for example. In other instances, this gap or bulge may cause for a wider edge seal with a more exaggerated device profile.

Yet another alternative method proposes depositing a barrier stack on a substrate using a multilayered, discontinuous decoupling layer in which a first decoupling layer is deposited in a pattern with spaces between different sections of the patterned first decoupling layer, and a second patterned decoupling layer is deposited over the first patterned decoupling layer and positioned to traverse the spaces between the different sections of the first patterned decoupling layer. The first and second patterned decoupling layers used in this method are discontinuous, and the combination of the first and second decoupling layers will isolate defects. While such a barrier stack may be capable of manufacture in bulk sheet form, due to the overlap of the first and second decoupling layers, cutting or sectioning the bulk roll or sheet to fit the target device will necessarily result in areas of the decoupling layer where there is no edge seal (i.e., where the decoupling layer is exposed at the edges). Use of such a multilayered, discontinuous decoupling layer risks optical non-uniformity resulting from the planar variations of the barrier stack caused by the discontinuous decoupling layers. Furthermore, formation of a sheet with such a discontinuous decoupling layer presents significant manufacturing and production difficulties, e.g., necessitating the creation of an unconventional three-dimensional multilayer barrier stack to accommodate the discontinuities.

SUMMARY

Aspects of the present invention relate to patterned multilayered stacks for protecting devices from permeation of moisture and gases, and to systems and methods of making the patterned multilayered stacks.

Aspects of the present invention are related to a barrier film including a substrate, a first layer on the substrate, the first layer including a barrier layer; a second layer on the first layer, the second layer including a decoupling or planarization layer; and a third layer on the second layer, the third layer including a barrier layer. Each of the first and third layers may have an area greater than an area of the second layer such that the second layer is completely enclosed between the first and third layers defining an edge perimeter surrounding the second layer that is completely sealed between the first and third layers.

In one embodiment, the second layer of the barrier film includes a pattern, each individual portion of the pattern having an area smaller than an area of each of the first and third layers and being completely enclosed between the first and third layers, defining an edge perimeter surrounding each individual portion of the second layer that is completely sealed between the first and third layers.

In another embodiment, the first layer and/or the third layer of the barrier film includes a pattern having a discrete area on the substrate, and wherein each discrete area of the first and/or third layer is greater than an area of each individual portion of the pattern of the second layer such that each individual portion of the pattern of the second layer is completely enclosed between the first and third layers.

In another embodiment, the pattern of the second layer of the barrier film includes a plurality of strips that are fully contained within the discrete area of each of the first and third layers such that the plurality of strips is completely enclosed between the discrete area of each of the first and third layers.

In another embodiment, the substrate of the barrier film includes a flexible plastic or polymer material.

In another embodiment, each of the first layer and the third layer of the barrier film spans an area less than or equal to an area of the substrate, and the first layer and the third layer may span the same or different areas.

In another embodiment, the first layer of the barrier film includes a pattern such that the substrate includes multiple discrete areas of the first layer each spanning an area smaller than an area of the substrate and separated from each other by uncoated regions.

In another embodiment, the third layer of the barrier film includes a pattern such that the first layer and substrate include multiple discrete areas of the third layer each spanning an area greater than an area of the second layer, and an area smaller than the area of the substrate, and wherein the multiple discrete areas of the first layer and the third layer may be coincident such that the uncoated regions separate the discrete areas including the first, second, and third layers from each other.

In another embodiment, a material of the first and third layers of the barrier film includes a metal, metal oxide, metal nitride, metal oxynitride, metal carbide, or metal oxyboride.

In another embodiment, a material of the second layer of the barrier film includes an organic polymer, inorganic polymer, organometallic polymer, hybrid organic/inorganic polymer system, or silicate.

In another embodiment, the barrier film further includes a fourth layer on the third layer, the fourth layer including a barrier layer, wherein the fourth layer has an area less than or equal to an area of the substrate or includes a pattern such that the first layer, third layer, and substrate include multiple discrete areas of the fourth layer each spanning an area greater than an area of the second layer, and an area smaller than the area of the substrate.

Another aspect of the present invention relates to a method of making a barrier film, the method including forming a first layer including a barrier layer over a substrate, the first layer having an area less than or equal to an area of the substrate; forming a second layer including a decoupling or planarization layer having an area less than the area of the first layer over the first layer; and forming a third layer including a barrier layer having an area greater than an area of the second layer and less than or equal to an area of the substrate over the second layer. The second layer may be completely enclosed between the first and third layers defining an edge perimeter surrounding the second layer that is completely sealed between the first and third layers. Forming at least one of the first, second, or third layers may include depositing a pattern of the respective first, second, or third layer, each portion of the pattern of the second layer being completely enclosed between respective adjacent first and third layers or portions thereof.

In one embodiment, the pattern of any of the first, second, or third layers of the barrier film is formed with a deposition device having a shutter-controlled nozzle configured to open and close at specified intervals to deposit a material of the respective layer during the interval when the shutter is open.

In another embodiment, the deposition device further includes a mask-technique device, such that the shutter-controlled nozzle is configured to deposit a material of the first and/or third layers in a pattern, and the mask-technique device is configured to deposit a material of the second layer in a pattern within each portion of the pattern of the first and/or third layers.

Another aspect of the present invention relates to a method of making a barrier film, the method including depositing a first layer including a barrier material having an area less than or equal to an area of a substrate over a substrate at a first deposition station; depositing a second layer including a decoupling or planarization material having an area less than the area of the first layer over the first layer at a second deposition station; and depositing a third layer including a barrier material having an area greater than an area of the second layer and less than or equal to an area of the substrate over the second layer at a third deposition station. The second layer may be completely enclosed between the first and third layers defining an edge perimeter surrounding the second layer that is completely sealed between the first and third layers. Forming at least one of the first, second, or third layers includes depositing a pattern of the respective first, second, or third layer, each portion of the pattern of the second layer being completely enclosed between respective adjacent first and third layers or portions thereof.

In one embodiment, the substrate of the barrier film is transported through a roll-to-roll processing system, and the first deposition station further includes a roller configured to transport the substrate through the first deposition station and a first deposition apparatus configured to deposit the first layer over the substrate; the second deposition station further includes a roller configured to transport the substrate with the deposited first layer through the second deposition station and a second deposition apparatus configured to deposit the second layer over the first layer on the substrate; and the third deposition station further includes a roller configured to transport the substrate with the deposited first and second layers through the third deposition station and a third deposition apparatus configured to deposit the third layer over the second layer on the substrate. The substrate may be transported from the first deposition station to the second deposition station and from the second deposition station to the third deposition station, after each respective station deposits the material of its respective layer.

In another embodiment, the first, second, and/or third deposition stations include one of a deposition apparatus configured to sputter the deposition material or a flash evaporator configured with a slit or a patterned output through which the deposition material exits the apparatus.

In another embodiment, each of the first, second, or third deposition stations further include a shutter attached to or in front of the respective deposition device and configured to open and close at specified intervals such that the respective deposition device will deposit the material of the respective layer while the shutter is opened, and/or a mask device attached to or in front of the respective deposition device and configured with a shape such that the respective deposition device will deposit the material of the respective layer in a pattern corresponding to the shape of the mask device.

In another embodiment, the substrate of the barrier film is transported through a batch-type or cluster batch-type processing system on a carrier. The first deposition station may further include a first deposition apparatus configured to deposit the first layer over the substrate transported on the carrier; the second deposition station may further include a second deposition apparatus configured to deposit the second layer over the first layer on the substrate transported on the carrier; and the third deposition station may further include a third deposition apparatus configured to deposit the third layer over the second layer on the substrate transported over the. The substrate may be transported on the carrier from the first deposition station to the second deposition station, and from the second deposition station to the third deposition station after each respective station deposits the material of its respective layer continuously on a conveyor belt or manually or automatically utilizing a robot or similar apparatus.

In another embodiment, the method of making the barrier film may further include preparing the barrier film including the substrate, first layer, second layer, and third layer for encapsulating or laminating a device by cutting the barrier film into individual barrier units between the portions of the pattern of the second layer completely enclosed between respective adjacent first and third layers, such that the portions of the second layer of each individual barrier unit are completely enclosed between the first and third layers defining an edge perimeter surrounding the second layer that is completely sealed between the first and third layers.

These and other aspects of the present invention will be more fully understood by referring to the following detailed description and the accompanying drawings.

BRIEF DESCRIPTION OF THE DRAWINGS

FIG. 6C is a schematic plan view of the patterned multilayered stack according to another embodiment of the present invention;

FIG. 9 is a schematic diagram illustrating a system for manufacturing the patterned multilayered stack according to an embodiment of the present invention using roll-to-roll (R2R) processing utilizing multiple drum (or roller) stations to deposit multiple layers of film;

FIG. 13 is a schematic diagram illustrating a system for manufacturing the patterned multilayered stack according to another embodiment of the present invention using a cluster batch process.

DETAILED DESCRIPTION

Figure 1:
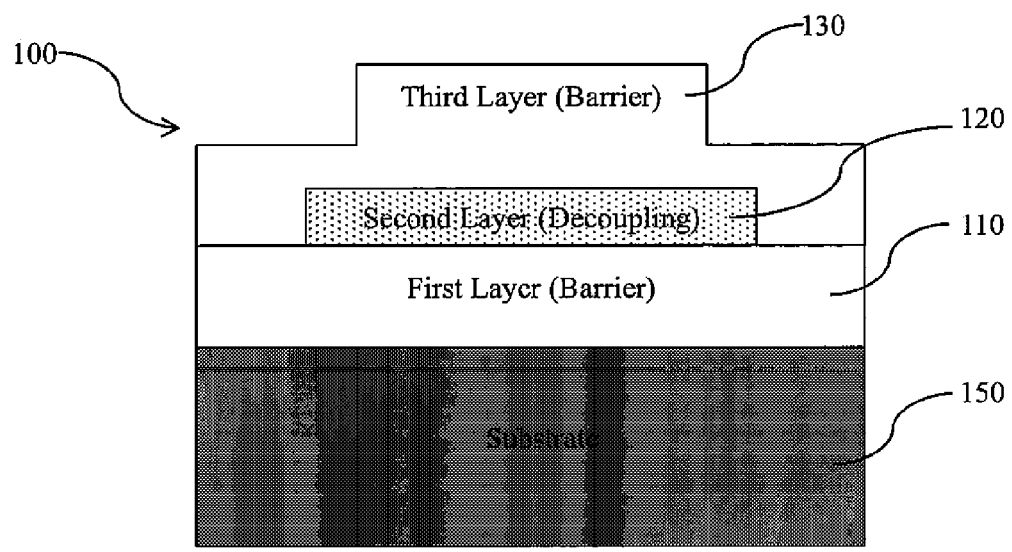
FIG. 1 is a cross-sectional schematic diagram of a patterned multilayered stack according to an embodiment of the present invention.

Aspects of embodiments of the present invention are directed to a patterned multilayer stack with edge seal, and to systems and methods of manufacturing the same. The patterned multilayer stack may be cut into individual multilayered units, each of which has intact edge seal around the decoupling layer, for lamination onto a device to be protected, e.g., an OLED device or the like. The intact edge seal around the decoupling layer of the individual multilayered units cut from the patterned multilayered film substantially prevents lateral transmission of damaging liquids, gases, and chemicals. Additionally, the bulk sheets can be made by roll-to-roll (R2R) processing or batch-style processing, enabling rapid, continuous fabrication of the bulk patterned multilayered film with edge seal, yielding high throughput and productivity, and a more versatile product.

According to embodiments of the present invention shown in FIGS. 1, 2, 3A, and 3B, for example, a bulk patterned multilayer film with edge seal 200 (shown in FIGS. 3A and 3B) includes a first bather layer 110 on a substrate or support 150, a second decoupling layer (or smoothing or planarization layer) 120 on the first barrier layer 110, and a third barrier layer 130 on the decoupling layer 120. The couple including the second layer 120 and third layer 130 is referred to herein as a "dyad," which is a term of art that is readily recognized by those of ordinary skill in the art. Each of the first 110 and third bather layers 130 covers more area on the substrate 150 than the second decoupling layer 120 such that the second decoupling layer 120 is surrounded on all its sides and edges by the barrier layers 110 and 130. By surrounding the otherwise highly permeable decoupling layer 120 with the barrier layers 110 and 130, a complete edge seal of the decoupling layer 120 may be provided. The bulk patterned multilayered film with edge seal 200 may then be cut into the individual multilayered units or stacks 100, and each individual multilayered unit or stack 100 may then be used to encapsulate a device (e.g., by lamination of the individual barrier unit onto the device) without damaging or compromising the edge seal around the decoupling layer 120. As used herein, the terms, "stack," "barrier stack," "barrier film," "multilayer bather film," "multilayer ultra-barrier film," "multilayered stack," "multilayered sheet" "multilayered unit," "multilayered film," and their variations are used interchangeably, and all terms refer to the bulk patterned multilayer film 200 and/or the individual multilayered unit or stacks 100 cut from the bulk patterned multilayer film 200. The film with patterned barrier areas 200 may also be laminated on a sheet where multiple devices have been fabricated, ensuring that the patterned areas are aligned with the devices to be protected. The stack 200, including each of the encapsulated devices, can then be then cut along lines between the multiple devices producing singular-encapsulated devices.

In some embodiments of the present invention, as shown in FIGS. 3A, 3B, 5A, 5B, 6A, 6B, 6C, 7A, 7B, 8A, and 8B, for example, the bulk patterned multilayer film 200 includes the first barrier layer 110, the second decoupling layer 120, and the third barrier layer 130 deposited in a pattern on a substrate or support 150. As used herein, the terms "substrate" and "support" are used interchangeably and refer to the sheet material on which the layers of the multilayered barrier stack 100 and 200 are deposited. Also, although the structure is generally described and illustrated herein as including a single dyad (i.e., a single couple of the second 120 and third layers 130), it is understood that multiple dyads may also be used. Indeed, the multilayered stack 200 may include any number of dyads, resulting in a structure that includes a stack of a first layer 110, followed by a couple of the second layer 120 and third layer 130, then followed by another couple of the second layer 120 and third layer 130, etc. After deposition of the first 110, second 120 and third 130 layers in a pattern on the substrate 150, the resulting patterned multilayer film 200 may be cut along the pattern to produce multiple individual multilayered units 100 from the bulk sheet 200. Each individual multilayered unit 100 may then be used to encapsulate a device, e.g., by lamination of the individual multilayered unit 100 on the target device. As described above, the film with patterned barrier areas 200 may also be laminated on a sheet where multiple devices have been fabricated, ensuring that the patterned areas are aligned with the devices to be protected. The stack 200, including each of the encapsulated devices, can then be then cut along lines between the multiple devices producing singular-encapsulated devices.

The material of the substrate 150 is not particularly limited, and may be any suitable substrate material. Some non-limiting examples of suitable materials include rigid substrates such as glass, ceramics, silicon, semiconductors, metals, and combinations thereof, and flexible substrates such as polymers, metals and metal foils, flexible glass, semiconductors, barrier coated plastic films, and combinations thereof. In some embodiments, however, the substrate 150 is capable of being loaded in and passing through stations of a roll to roll processing system, for example, in these embodiments, the substrate 150 may be a flexible plastic or polymer material, such as polyethylene naphthalate (PEN), polyether ether ketone (PEEK), polycarbonate (PC), polyimide (PI), or polyethylene terephthalate (PET). In some embodiments, the substrate 150 may have a polymer smoothing layer, for example, the substrate may be a PEN material having a polymer smoothing layer, such as Dupont Teijin Film PQDA5.

The first layer 110 of the patterned multilayer film 200 serves as a barrier layer, preventing the permeation of damaging gases, liquids, and chemicals to an encapsulated or laminated device. As used herein, the terms "first layer," "first barrier layer," "first oxide layer," and "first inorganic layer" are used interchangeably and refer to the layer 110 of the multilayered film 100 and 200 that is deposited directly on the substrate 150. The first layer 110 is deposited on the substrate 150 to span a first area that is greater than a second area spanned by the second layer 120 (i.e., the decoupling layer), as described further below. The first area covered by the first layer 110 may span the entire area of the substrate 150, or may span an area smaller than the area of the substrate 150. Alternatively, the first layer 110 may be deposited on the substrate 150 in a pattern (as shown in FIGS. 5B, 6A, 6B, 6C, 8A, and 8B, for example) such that the substrate 150 includes multiple discrete sections or areas 160 that include the deposited first layer 110. In such an embodiment, as shown in FIGS. 5A, 5B, 6A, 6B, and 6C, the discrete areas 160 of first layer 110 are separated from each other by uncoated areas 170 of substrate 150. As discussed further below, the second 120 and third layers 130 are deposited on the first layer 110. As such, upon completion of the patterned multilayered film 200 according to this embodiment, the individual multilayered units 100 can be cut from the bulk sheet 200 by cutting between the individual multilayered units 100 in the uncoated spaces or areas 170 of the substrate 150. This configuration eliminates or at least substantially prevents the propagation of any defects that may be caused by the cutting of the barrier film 200. In other embodiments, as described above, the film with patterned barrier areas 200 may also be laminated on a sheet where multiple devices have been fabricated, ensuring that the patterned areas are aligned with the devices to be protected. The stack 200, including each of the encapsulated devices, can then be then cut along lines between the multiple devices producing singular-encapsulated devices.

The first layer 110 may be deposited on the substrate 150 by any suitable deposition technique. Some non-limiting examples of suitable deposition techniques include vacuum processes such as sputtering, evaporation, sublimation, physical vapor deposition (PVD), chemical vapor deposition (CVD), metalorganic chemical vapor deposition, plasma enhanced chemical vapor deposition, electron cyclotron resonance-plasma enhanced chemical vapor deposition, and combinations thereof. For example, in some embodiments, the first layer 110 may be deposited on the substrate 150 by sputtering (e.g., sputtering oxides on the substrate 150 to form the first layer 110). The sputtering deposition technique offers the advantages of faster deposition, better layout properties, process stability, control, fewer particles, and fewer arcs. The conditions of the sputtering deposition are not particularly limited, and as would be understood by those of ordinary skill in the art, the conditions will vary depending on the area of the target and the distance between the target and the substrate 150. In some embodiments, however, the first (barrier) layer 110 may be deposited on an entire web area of the entire substrate 150 (as schematically depicted in FIGS. 1 and 4), or may be masked or otherwise controlled to cover an area smaller than the web area of the entire substrate 150 (as schematically depicted in FIGS. 2, 3A, 3B, 7A and 7B) or to cover a patterned area 160 on the substrate 150 (as schematically depicted in FIGS. 5A, 5B, 6A, 6B, 6C, 8A and 8B). However, the area of the substrate 150 on which the first layer 110 is deposited is larger than the area covered by the second (decoupling) layer 120 such that the area of the first layer 110 spans beyond the area of the second layer 120.

The material of the first layer 110 is not particularly limited, and may be any material known in the field suitable for substantially preventing or reducing the permeation of damaging gases, liquids, and chemicals (e.g., oxygen and water vapor) to an encapsulated or laminated device. Some non-limiting examples of suitable materials for the first layer 100 include metals, metal oxides, metal nitrides, metal oxynitrides, metal carbides, metal oxyborides, and combinations thereof. Those of ordinary skill in the art would be capable of selecting a suitable metal for use in the oxides, nitrides, and oxynitrides based on the desired properties of the layer 110. However, in some embodiments, for example, the metal may be Al, Zr, Ti, or Si (i.e., aluminum oxides such as $Al_2O_3$, silicon oxides, nitrides, or oxynitrides).

The properties of the first layer 110 (e.g., including density, refractive index, and thickness) are not particularly limited. In particular, the properties of the first layer 110 may take on any value suitable for the layer 110 to function as a barrier layer. As is understood by those of ordinary skill in the art, the values of the properties will vary depending on the material of the layer 110. As such, those of ordinary skill in the art would be capable of determining (or calculating) the appropriate properties of the first layer 110 based on the material of the layer.

The second layer 120 of the patterned multilayer film 100 or 200 serves as a planarization, decoupling, and/or smoothing layer. The second layer 120 is deposited on the first layer 110, and under the third layer 130, so that the second layer 120 is enclosed between the first 110 and third 130 layers. As used herein, the terms "second layer," "polymer layer," "smoothing layer," "decoupling layer," and "planarization layer" are used interchangeably, and all terms refer to the second layer 120 deposited between the first 110 and third 130 layers. The second layer 120 may be deposited on the first layer 110 by any suitable deposition technique capable of confining the deposited second layer 120 to an area on the first layer 110 that is smaller than the area spanned by each of the first 110 and third 130 layers in all directions (i.e., the second layer 120 is deposited such that it may be completely enclosed within the first 110 and third 130 layers). Some non-limiting examples of suitable deposition techniques include vacuum processes and atmospheric processes. Some non-limiting examples of suitable vacuum processes for deposition of the second layer 120 include flash evaporation or plasma deposition and polymerization. Some non-limiting examples of suitable atmospheric processes for deposition of the second layer 120 include spin coating, ink jet printing, screen printing, and spraying. In some embodiments, for example, the second layer 120 is deposited on the first layer 110 by flash evaporation.

In embodiments in which the first (barrier) layer 110 is deposited to cover the entire web area of the substrate 150 (as generally shown in FIGS. 1 and 4) or to cover a continuous area on the substrate 150 that is smaller than the entire web area of the substrate 150 (as generally shown in FIGS. 2, 3A, 3B, 6A, 6B, 6C, 7A, and 7B), the second (decoupling) layer 120 may be deposited on the first layer 110 in a pattern (as shown in FIGS. 3A, 3B, 6A, 6B, and 6C). The pattern of the second layer 120 is not particularly limited so long as the individual portions of the second layer 120 created by the pattern have an area completely within the area of the first layer 110. Also, in embodiments including multiple dyads, the second layers 120 of the different dyads may have the same pattern or different patterns.

Figure 2:
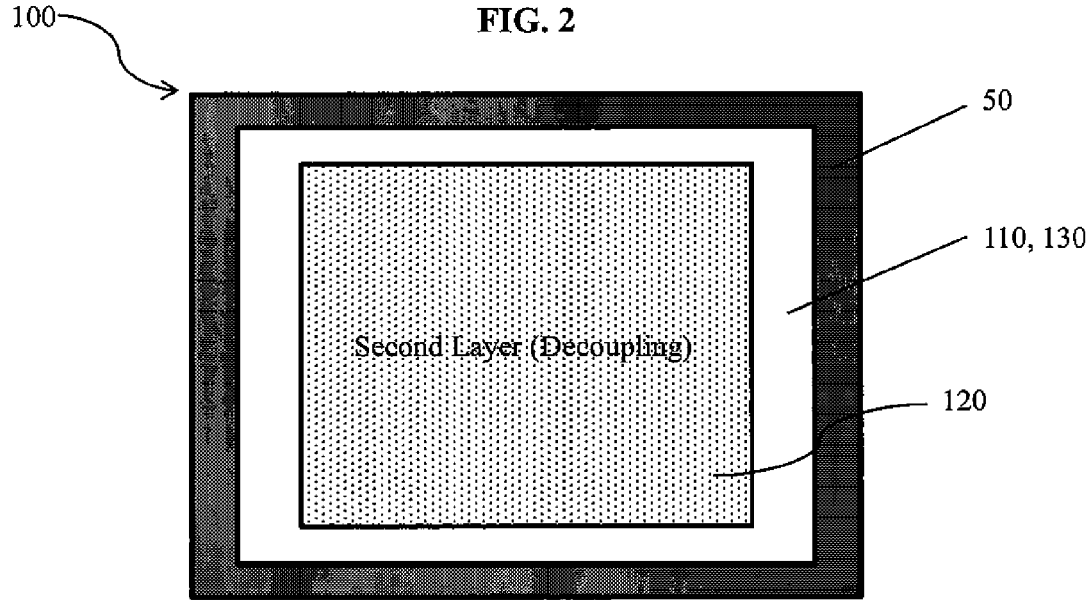
FIG. 2 is a schematic plan view of the patterned multilayered stack of FIG. 1.
Figure 3A:
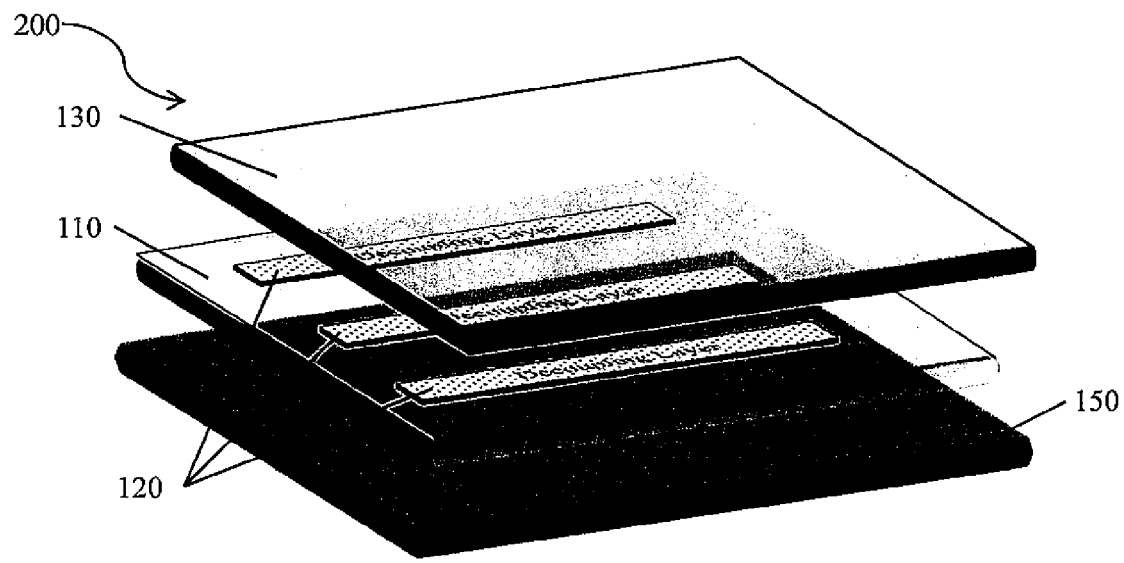
FIG. 3A is a schematic exploded perspective view of the patterned multilayered stack according to an embodiment of the present invention.
Figure 3B:
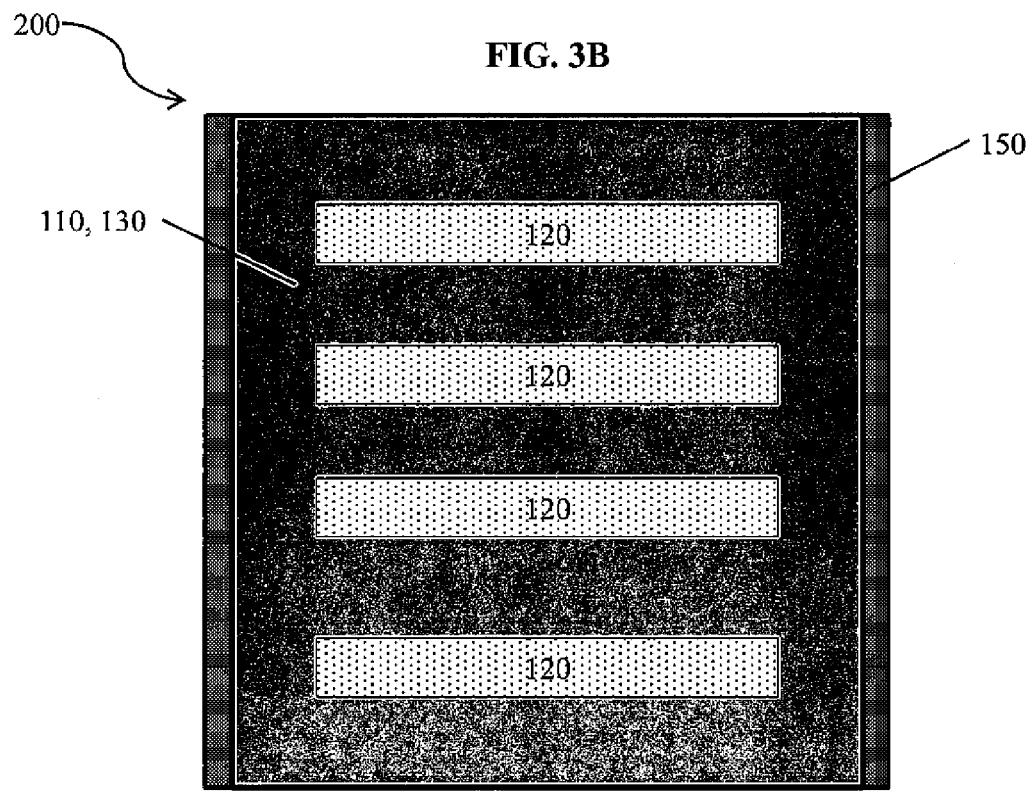
FIG. 3B is a schematic plan view of the patterned multilayered stack of FIG. 3A.
Figure 4:
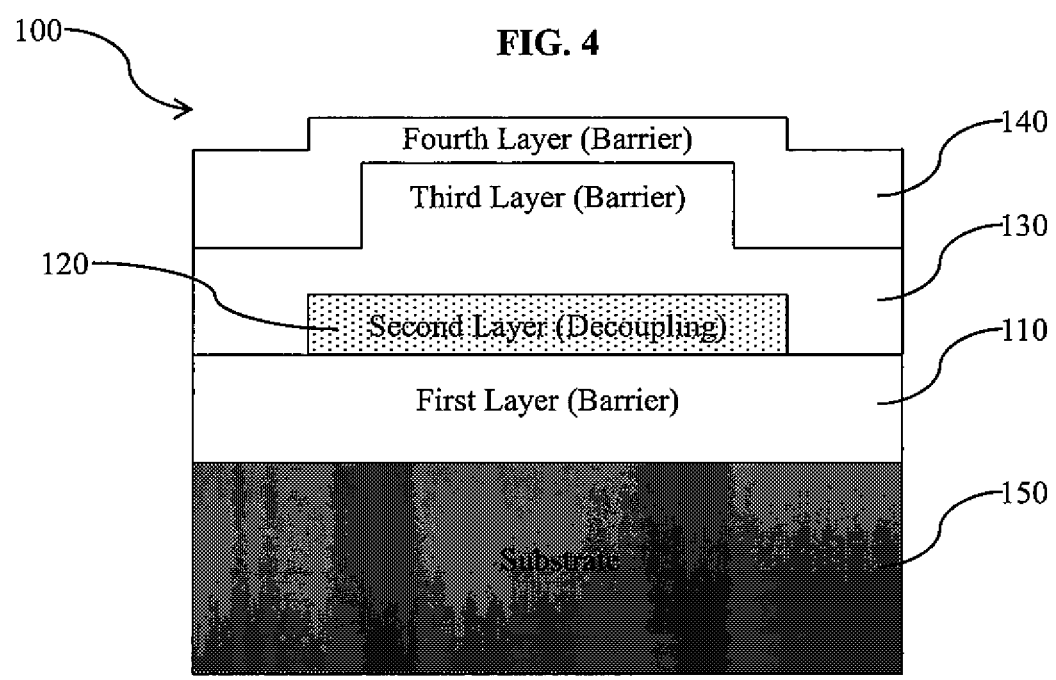
FIG. 4 is a cross-sectional schematic diagram of the patterned multilayered stack according to another embodiment of the present invention.

In some embodiments, for example, as shown in FIGS. 3A and 3B, the pattern of the second layer 120 includes a plurality (i.e., at least two) of strips that are all fully contained within the area spanned by each of the first 110 and third 130 layers. While the second (decoupling) layer 120 is shown in FIGS. 2, 3A, and 3B as including a plurality of separated strips of decoupling material, it is understood that the second layer 120 is not limited to this configuration, and that the second layer 120 can have any shape and any pattern.

Figure 5A:
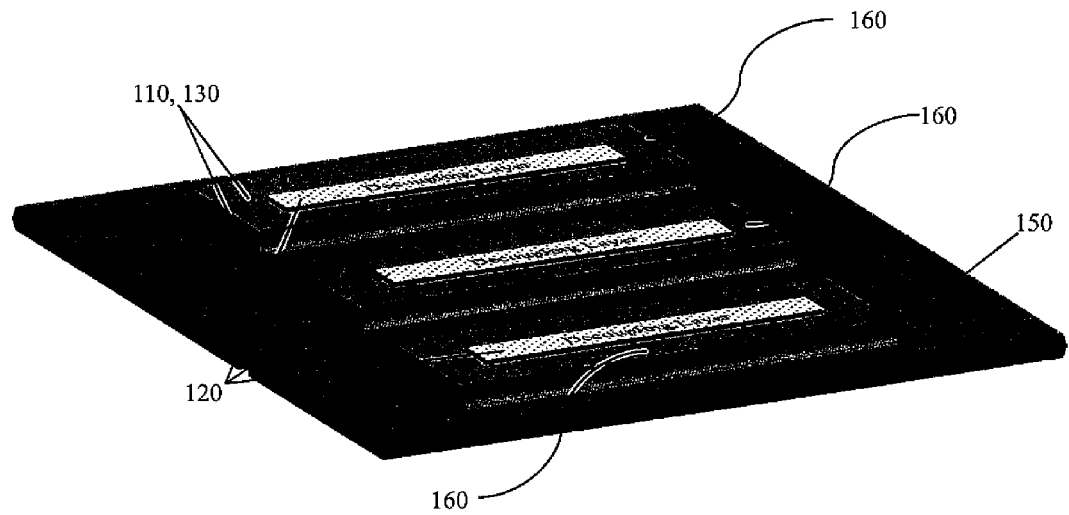
FIG. 5A is a schematic perspective view of the patterned multilayered stack according to another embodiment of the present invention.
Figure 5B:
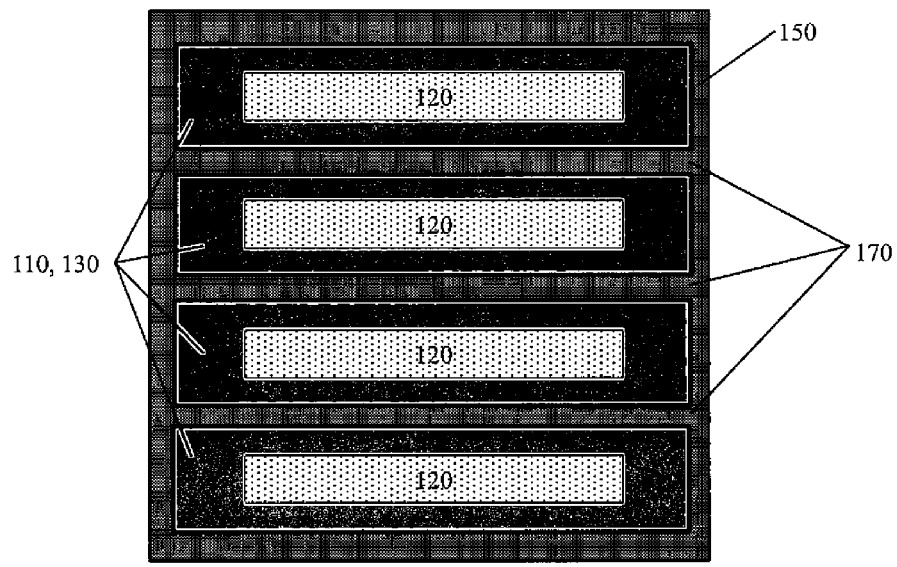
FIG. 5B is a schematic plan view of the patterned multilayered stack of FIG. 5A.
Figure 6A:
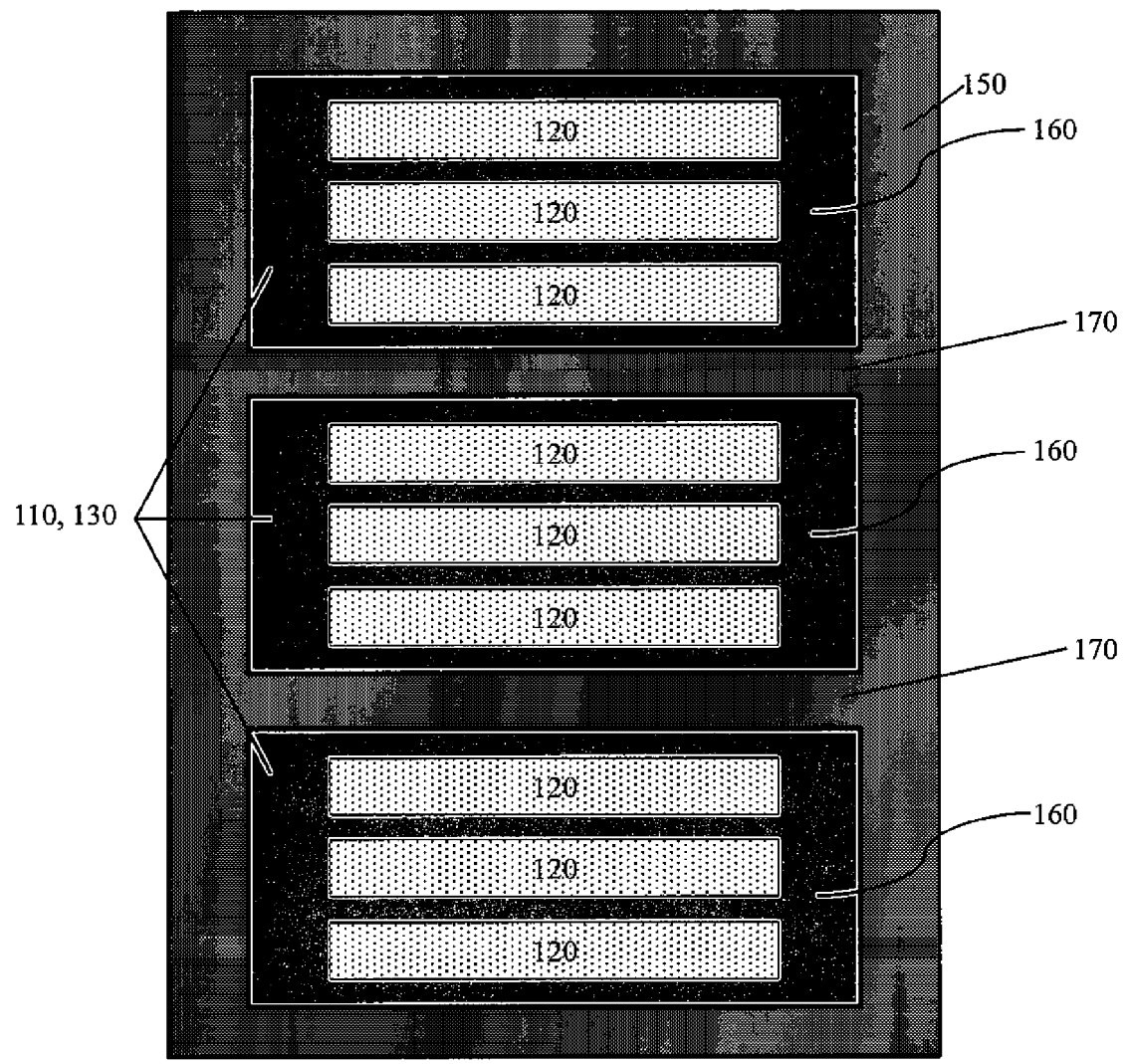
FIG. 6A is a schematic plan view of the patterned multilayered stack according to another embodiment of the present invention.
Figure 6B:
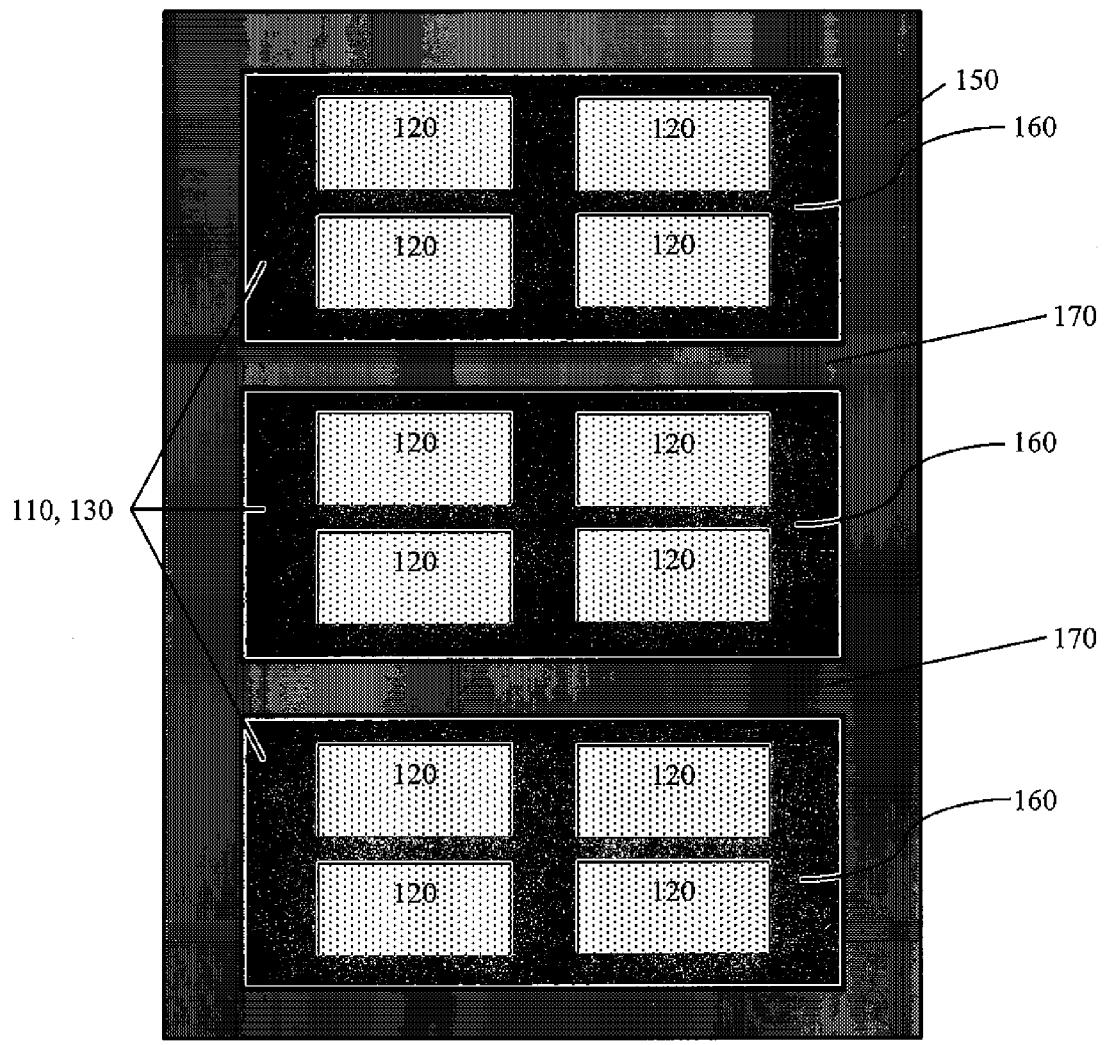
FIG. 6B is a schematic plan view of the patterned multilayered stack according to another embodiment of the present invention.

In other embodiments in which the first (barrier) layer 110 is deposited in a pattern to form discrete, separated areas 160 of the first layer 110 on the substrate 150 (as shown in FIGS. 5A and 5B), the second (decoupling) layer 120 may be formed on the discrete areas 160 of the first layer 110 to cover an area on the first layer 110 that is smaller than the discrete area 160 of the first layer 110. This configuration is shown generally in FIGS. 5A and 5B. Alternatively, the second layer 120 may be deposited in a mini-pattern on the discrete area 160 of the first layer 110, as generally shown in FIGS. 6A, 6B, and 6C. In this configuration, the substrate 150 includes multiple discrete units 160 that are separated by uncoated portions 170 of substrate 150, and each of the individual (or discrete) units 160 includes a patterned second layer 120 much like the ones depicted in FIGS. 3A and 3B. In such an embodiment, each individual (discrete) unit 160 can be cut from the larger substrate 150 by cutting along the lines of uncoated substrate 170, and then, each individual unit 160 may be further cut into smaller units by cutting between the lines created by the pattern of the second layer 120. Such an embodiment enables further fine-tuning of the size of the film 100 to be used in protecting a device.

The pattern of the second (decoupling) layer 120 (or the first layer 110) may be created using any suitable technique. For example, the pattern may be created using a mask placed over the first layer 110 or substrate 150 prior to deposition of the second layer 120 or first layer 110, respectively. For example, the mask can include open areas in which the first layer 110 substrate 150 would be exposed, enabling deposition of the first layer 110 or second layer 120 material in the exposed sections. Upon removal of the mask, the underlying substrate 150 and/or first layer 110 would include areas in which the material of the first 110 or second 120 layer is deposited (i.e., corresponding to the open areas of the mask) and areas in which no material is deposited (corresponding to the solid portions of the mask). In some embodiments, the mask need not be placed on the substrate 150 or first layer 110, but may be placed on the deposition apparatus. For example, a mask (such as a series of spaced apart bars) may be placed in front of the output of the deposition apparatus so that upon deposition the deposition material is deposited on the substrate 150 or first layer 110 in the areas corresponding to the spaces of the mask (e.g., the spaces between the bars). Such a technique is particularly useful with an apparatus that moves a sheet or roll of the substrate 150 laterally through the deposition apparatus. In particular, in such an apparatus, the sheet continues to move through or by the deposition apparatus. The mask in front of the deposition apparatus creates areas on the substrate 150 (or first layer 110) in which the deposition material is deposited (i.e., the area of the substrate 150 corresponding to the spaces between the mask) and areas on the substrate 150 (or first layer 110) in which the deposition material is not deposited (i.e., the areas of the substrate 150 corresponding to the solid portions (e.g., the bars) of the mask). Examples of such a system include a roll-to-roll processing system and a batch-style processing system using a conveyor belt, described in further detail below.

Figure 11:
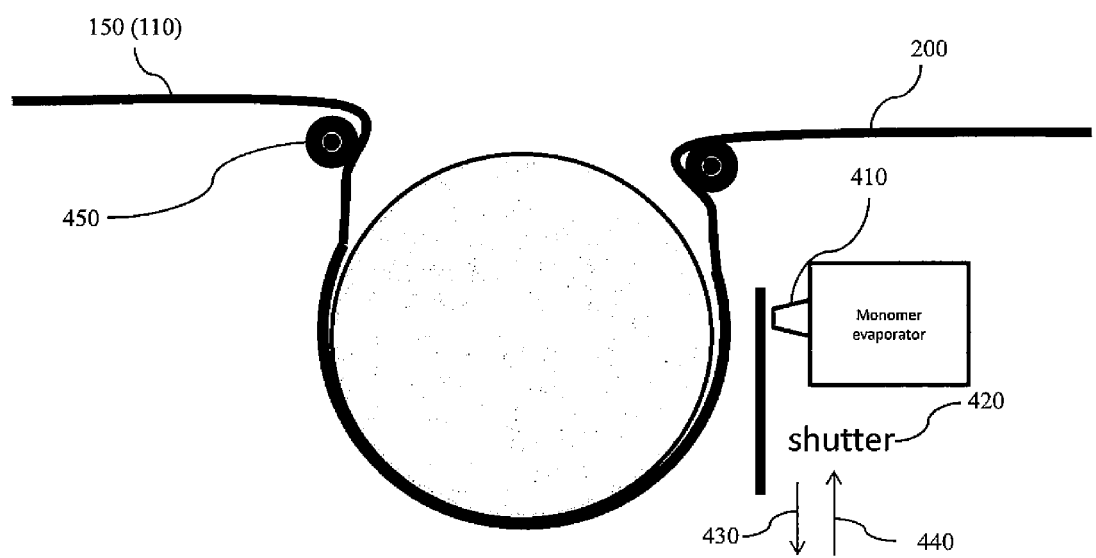
FIG. 11 is a schematic diagram illustrating a system for manufacturing the patterned multilayered stack according to another embodiment of the present invention using a shutter-controlled nozzle.

Alternatively, the pattern of the second 120 or first 110 layer may be created by the use of a shutter-controlled nozzle 420 during the deposition process, as shown generally in FIG. 11. In such a process, the deposition apparatus 410 can be fitted with a shutter 420 that opens 430 and closes 440 at specified intervals so that material is deposited on the substrate 150 or first layer 110 when the shutter 420 is opened 430 but no material is deposited when the shutter 420 is closed 440. Such a technique is particularly useful with an apparatus 450 that moves a sheet or roll of the substrate 150 laterally through the deposition apparatus 410 (such as, for example, a roll-to-roll processing system or a batch style processing system using a conveyor belt, described further below). In particular, in such an apparatus 450, the sheet 150 continues to move through or by the deposition apparatus 410 while the shutter 420 opens 430 and closes 440, thereby creating areas on the substrate 150 (or first layer 110) in which the deposition material is deposited (i.e., the area of the substrate 150 passing through or by the deposition apparatus 410 when the shutter 420 is opened 420) and areas on the 150 (or first layer 110) in which the deposition material is not deposited (i.e., the areas of the substrate 150 passing through or by the deposition apparatus 410 when the shutter 420 is closed 440). Examples of such a system 450 include a roll-to-roll processing system, and a batch style processing system using a conveyor belt, described in further detail below.

Figure 10:
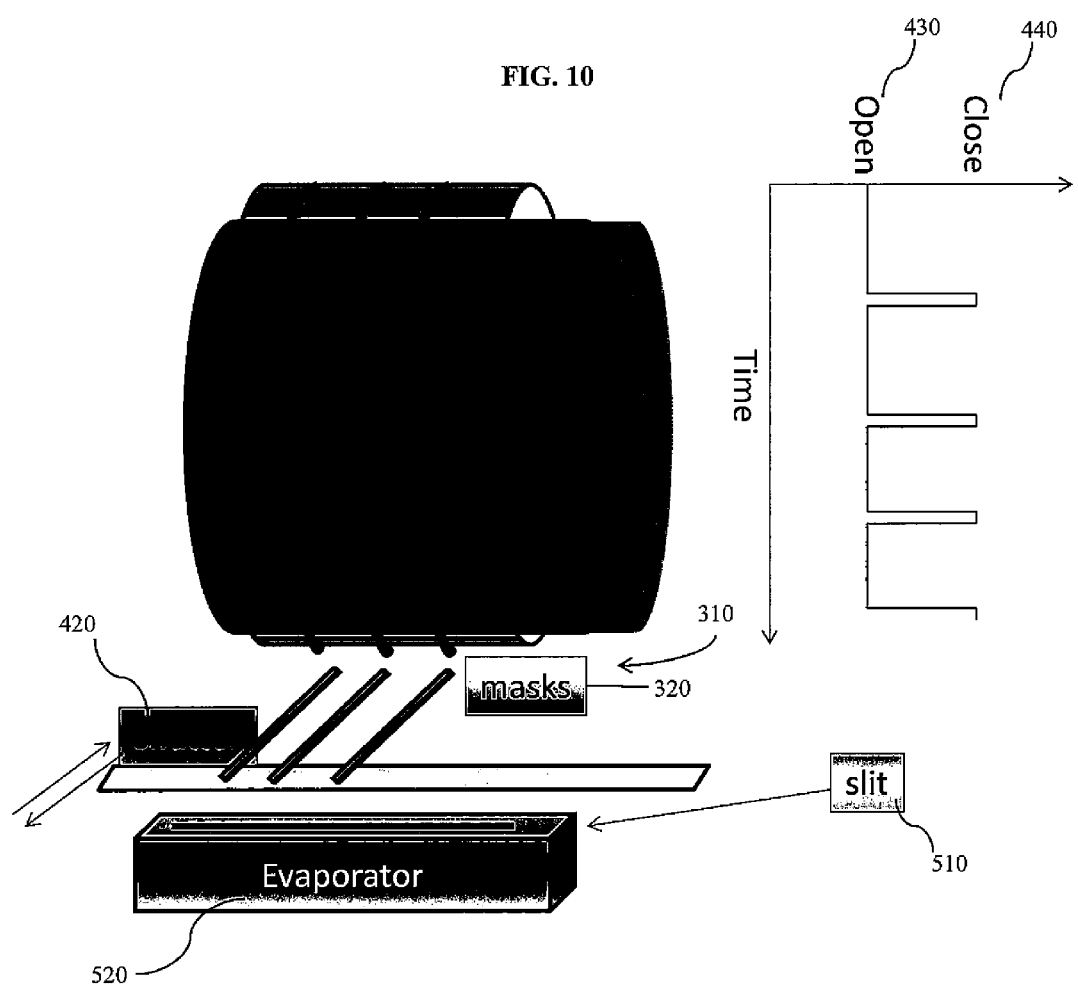
FIG. 10 is a schematic diagram illustrating a system for manufacturing the patterned multilayered stack according to another embodiment of the present invention using a combination of a shutter-controlled nozzle with a mask technique.

In some embodiments, deposition of the patterned first 110 or second layer 120 may also combine the shutter-based deposition 410 technique with a mask technique 310, as shown generally in FIG. 10. For example, to prepare a sheet or roll 150 with multiple, discrete multilayered units 160 having a mini-patterned second layer 120 (such as that shown in FIGS. 6A, 6B, and 6C), a mask 320 can be used to create the mini-patterns of the second layer 120, while the shutter 420 can be used to ensure that the mini-patterned second layer 120 is only deposited on the areas of the substrate 150 in which the first layer 110 is deposited.

The second layer 120 can include any suitable material capable of acting as a planarization, decoupling, and/or smoothing layer (e.g., a polymer or other organic material, or an inorganic material). Some non-limiting examples of suitable materials include organic polymers, inorganic polymers, organometallic polymers, hybrid organic/inorganic polymer systems, silicates, and combinations thereof. In some embodiments, for example, the material of the second layer 120 may be an acrylate-containing polymer, an alkylacrylate-containing polymer (including but not limited to methacrylate-containing polymers), or a silicon-based polymer. In embodiments including multiple dyads, the second layers 120 of the different dyads may be the same material or different materials.

The second layer 120 may have any suitable thickness such that the layer 120 has a substantially planar and/or smooth layer surface. As used herein, the term "substantially" is used as a term of approximation and not as a term of degree, and is intended to account for normal variations and deviations in the measurement or assessment of the planar or smooth characteristic of the second layer 120.

The third layer 130 of the patterned multilayer barrier film 200 serves as another barrier layer, preventing the permeation of damaging gases, liquids, and chemicals to a protected device. The third layer 130 is deposited on the second layer 120, and together with the first (barrier) layer 110, surrounds and sandwiches the second (decoupling) layer 120. As used herein, the terms "third layer," "third barrier layer," "third oxide layer," and "third inorganic layer" are used interchangeably to refer to the layer 130 of the multilayered film 200 deposited directly on the second layer 120. The third layer 130 is deposited on the second layer 120 to span a third area that is greater than the second area spanned by the second layer 120 (i.e., the decoupling layer). Like the first area spanned by the first layer 110, the third area covered by the third layer 130 may span the entire area of the substrate 150, or may span an area smaller than the area of the substrate 150. Like the first layer 110, the third layer 130 may also be deposited in a pattern, but the pattern of the third layer 130 covers the entire area of each of the portions of the second layer 120. Indeed, the pattern of the third layer 130 may generally match the pattern of the first layer 110, and the patterned third layer 130 may be generally aligned with the pattern of the first layer 110. This configuration is generally shown in FIGS. 5A and 5B (depicting the individual multilayered units 160 created from the use of generally aligned, patterned first 110 and third layers 130) and FIGS. 6A, 6B and 6C (depicting the individual multilayered units 160 created from the use of generally aligned, patterned first 110 and third 130 layers, and a mini-patterned second layer 120).

As discussed above, in some embodiments, the third layer 130 may be deposited in a pattern that generally matches and aligns with the pattern of the first layer 110. This configuration yields a substrate 150 that includes multiple discrete or individual multilayered units 160, each of which includes the deposited first layer 110, the second layer 120 (either mini-patterned as in FIGS. 6A, 6B, and 6C, or continuous within the individual barrier unit as in FIGS. 5A and 5B), and the deposited third layer 130. As shown in FIGS. 5A, 5B, 6A, 6B, and 6C, the individual multilayered units 160 are separated from each other by uncoated areas 170 of substrate 150. As such, the individual multilayered units 160 can be cut from the bulk sheet 200 by cutting between the individual multilayered units 160 in the uncoated spaces 170 of the substrate 150. This configuration eliminates or at least substantially prevents the propagation of any defects that may be caused by the cutting of the multilayered film 200.

Figure 7A:
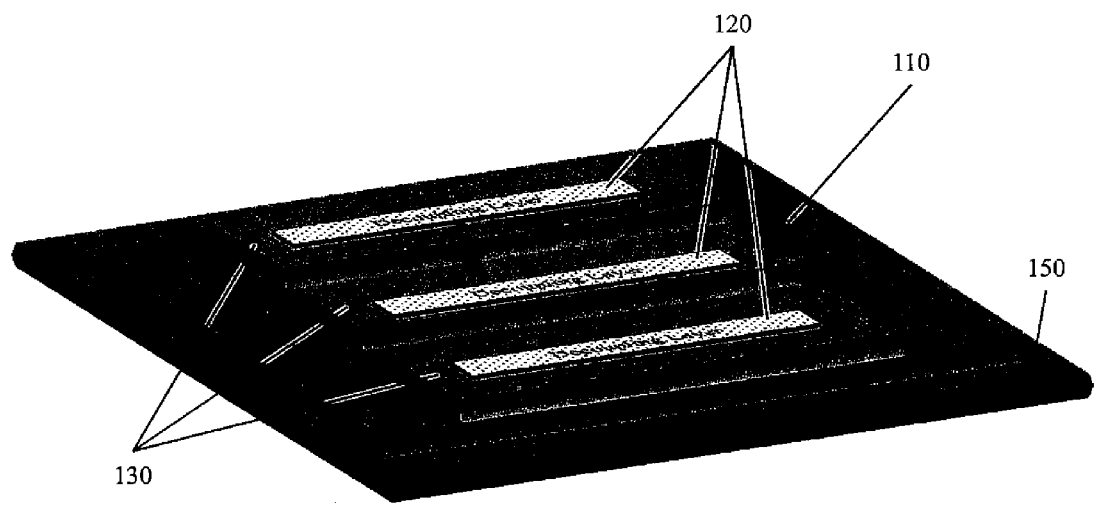
FIG. 7A is a schematic perspective view of the patterned multilayered stack according to another embodiment of the present invention.
Figure 7B:
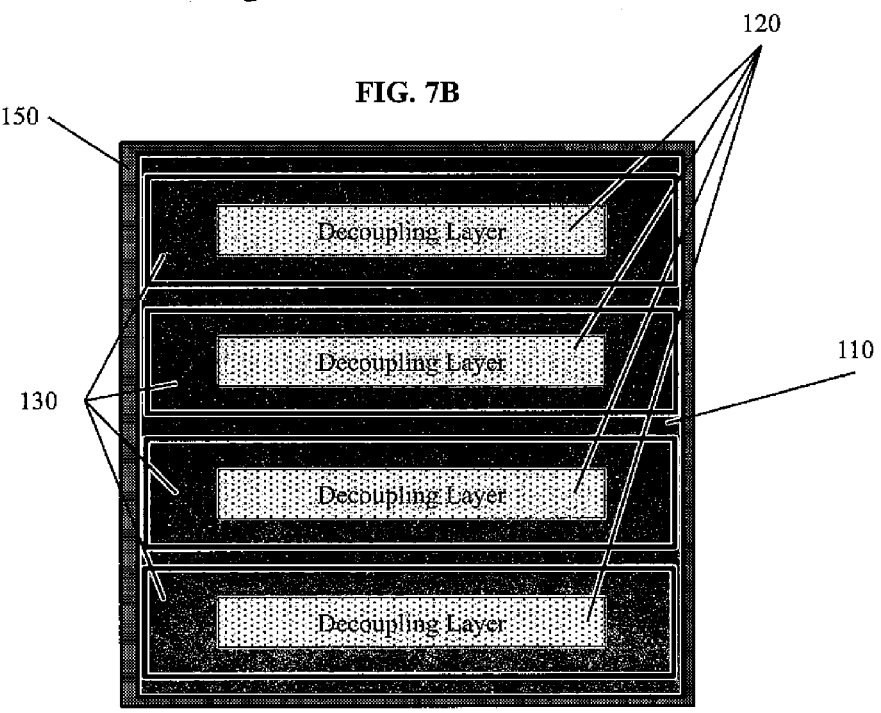
FIG. 7B is a schematic plan view of the patterned multilayered stack of FIG. 7A.
Figure 8A:
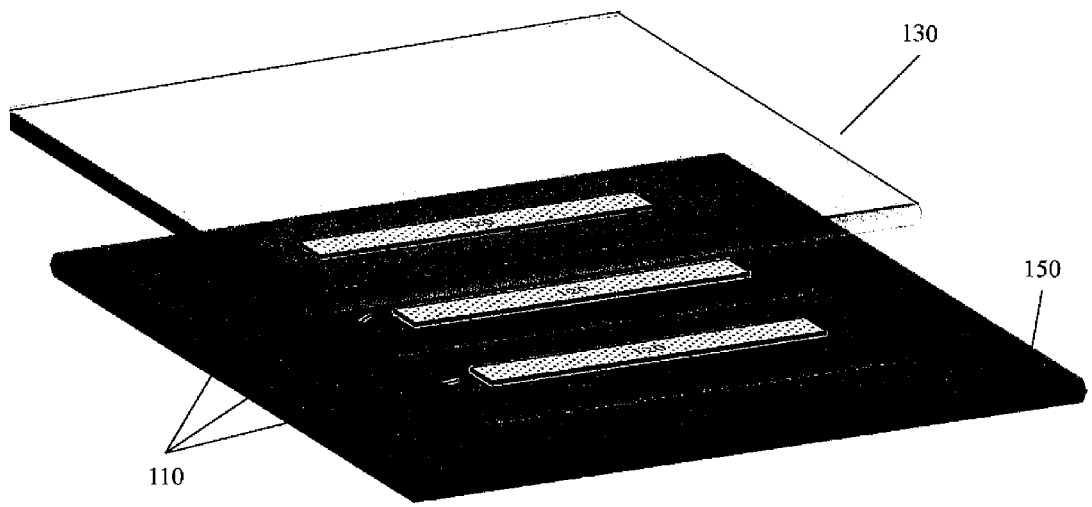
FIG. 8A is a schematic exploded perspective view of the patterned multilayered stack according to another embodiment of the present invention.
Figure 8B:
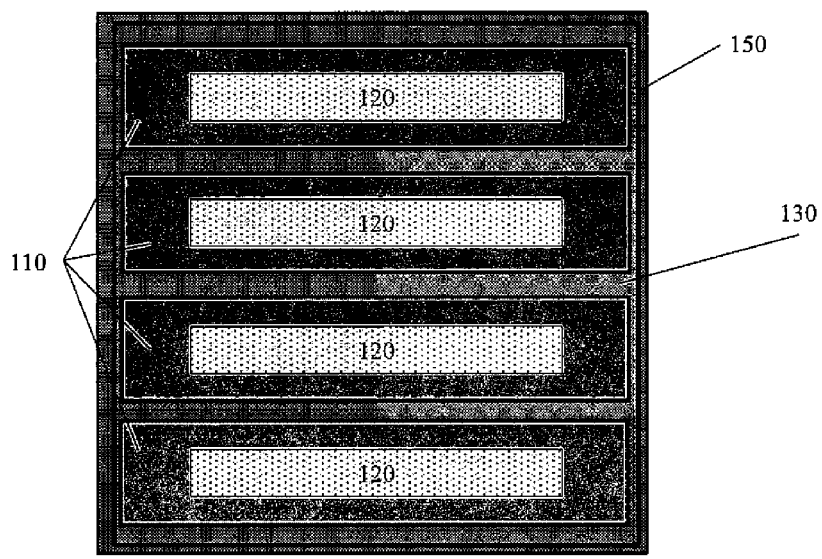
FIG. 8B is a schematic plan view of the patterned multilayered stack of FIG. 8A.

In some alternative embodiments, the first 110 and third 130 layers need not have matching patterns. For example, as shown in FIGS. 7A and 7B, in some embodiments, the first layer 110 may be deposited as a blanket layer to cover a continuous surface (or the entire surface) of the substrate 150 while the third layer 130 may be patterned to cover only the areas covered by the patterned second layer 120. Alternatively, as shown in FIGS. 8A and 8B, the first layer 110 may be deposited in a pattern and the third layer 130 may be deposited as a blanket layer to cover a continuous surface (or the entire surface) of the first layer 110 and/or substrate 150. These configurations reduce the thickness of the barrier film 200 in the spaces between the decoupling layers 120, thereby making it easier to cut the individual barrier units 100 from the bulk sheet or roll 200 without compromising the edge seal around the decoupling layer 120. Additionally, in embodiments including multiple dyads, the third layers 130 of the different dyads may have the same pattern or different patterns. Alternatively, the third layers 130 of the different dyads may both be blanket layers, or one may be a blanket layer while the others are patterned, etc.

The third layer 130 may be deposited on the substrate 150 by any suitable deposition technique. Some non-limiting examples of suitable deposition techniques include vacuum processes such as sputtering, evaporation, sublimation, physical vapor deposition (PVD), chemical vapor deposition (CVD), metalorganic chemical vapor deposition, plasma enhanced chemical vapor deposition, electron cyclotron resonance-plasma enhanced chemical vapor deposition, and combinations thereof. For example, in some embodiments, the third layer 130 may be deposited on the substrate 150 (and the first layer 110 and the second layer 120) by sputtering (e.g., sputtering oxides on the substrate 150, first layer 110, and second layer 120 to form the third layer 130). The sputtering deposition technique offers the advantages of faster deposition, better layout properties, process stability, control, fewer particles, and fewer arcs. The conditions of the sputtering deposition are not particularly limited, and as would be understood by those of ordinary skill in the art, the conditions will vary depending on the area of the target and the distance between the target and the substrate. In some embodiments, however, the third (barrier) layer 130 may be deposited over the entire web area of the entire substrate 150 (as generally shown in FIGS. 1 and 4), or may be masked to cover an area smaller than the web area of the entire substrate 150 (as generally shown in FIGS. 2, 3A, and 3B) or to cover a patterned area on the substrate 150 (as generally depicted in FIGS. 5A, 5B, 6A, 6B, 6C, 7A, and 7C). However, the area of the substrate 150 on which the third layer 130 is deposited is larger than the area covered by the second (decoupling) layer 120 such that the area of the third layer 130 spans beyond the area of the second layer 120, as discussed above.

The material of the third layer 130 is not particularly limited, and may be any material known in the field suitable for substantially preventing or reducing the permeation of damaging gases, liquids, and chemicals (e.g., oxygen and water vapor) to a protected device. Some non-limiting examples of suitable materials for the third layer 130 include metals, metal oxides, metal nitrides, metal oxynitrides, metal carbides, metal oxyborides, and combinations thereof. Those of ordinary skill in the art would be capable of selecting a suitable metal for use in the oxides, nitrides, and oxynitrides based on the desired properties of the layer. However, in some embodiments, for example, the metal may be Al, Zr, Ti, or Si (i.e., aluminum oxides such as $Al_2O_3$, silicon oxides, nitrides, or oxynitrides). Also, in embodiments including multiple dyads, the third layers 130 of the different dyads may be the same material or different materials.

The properties of the third layer 130 (e.g., including density, refractive index and thickness) are not particularly limited. In particular, the properties of the third layer 130 may take on any value suitable for the layer to function as a barrier layer. As is understood by those of ordinary skill in the art, the values of the properties will vary depending on the material of the layer 130. As such, those of ordinary skill in the art would be capable of determining (or calculating) the appropriate properties of the third layer 130 based on the material of the layer.

In addition to the first 110, second 120, and third 130 layers, some exemplary embodiments of the patterned multilayer barrier film 200 may include a fourth layer 140 deposited on the third layer 130, as generally depicted in FIG. 4. The fourth layer 140 of the patterned multilayer barrier film 200 also serves as a barrier layer, preventing the permeation of damaging gases, liquids, and chemicals to an encapsulated or laminated device. The fourth layer 140 is deposited on the third layer 130, and specifically enhances the barrier properties at the edge of the patterned multilayer barrier film 100 where the propensity for defects may increase, and the ability to withstand these defects may decrease, with the thickness of the decoupling layer 140 as it becomes or approaches zero. As used herein, the terms "fourth layer," "fourth barrier layer," "fourth oxide layer," and "fourth inorganic layer" are used interchangeably.

The fourth layer 140 is deposited on the third layer 130 either as a continuous layer spanning the entire area of the substrate 150 (i.e., the substrate coated 150 with the first 110, second 120, and third 130 layers), or a continuous layer spanning an area smaller than the area of the substrate 150. Like the first 110 and third 130 layers, the fourth layer 140 may also be deposited in a pattern. The pattern of the fourth layer 140 may generally match the pattern of the first 110 or third 130 layer, and the patterned fourth layer 140 may be generally aligned with the pattern of the first 110 and/or third 130 layer.

As discussed above, in some embodiments, the fourth layer 140 may be deposited in a pattern that generally matches and aligns with the pattern of the first 110 and/or third 130 layer. This configuration yields a substrate 150 that includes multiple discrete or individual multilayered units 160, each of which includes the deposited first layer 110, the second layer 120 (either mini-patterned as in FIGS. 6A, 6B, and 6C, or continuous within the individual barrier unit as in FIGS. 5A and 5B), the deposited third layer 130, and the deposited fourth layer 140.

In some alternative embodiments, the first 110, third 130 and/or fourth 140 layers need not have matching patterns. For example, in some embodiments, the first layer 110 may be deposited as a blanket layer to cover a continuous surface (or the entire surface) of the substrate 150 while the third layer 130 may be patterned to cover only the areas covered by the patterned second layer 120, and the fourth layer 140 may be a blanket, continuous layer. Alternatively, the first layer 110 may be deposited in a pattern and the third layer 130 may be deposited as a blanket layer to cover a continuous surface (or the entire surface) of the first layer 110 and/or substrate 130, and the fourth layer 140 may be a continuous layer. In short, any combination of blanket and patterned layers may be used for the first 110, third 130, and fourth 140 layers. Also, as noted above, in embodiments including multiple dyads, the third layers 130 of the different dyads may be the same or different.

The fourth layer 140 may be deposited on the third layer 130 by any suitable conformal deposition technique capable of sealing defects within the preceding layers 110, 120, and 130 of the multilayer barrier film 200. Some non-limiting examples of suitable conformal deposition techniques include atomic layer deposition (ALD), chemical vapor deposition (CVD), metalorganic chemical vapor deposition, plasma enhanced chemical vapor deposition, evaporation, sublimation, electron cyclotron resonance-plasma enhanced chemical vapor deposition, and combinations thereof. In some embodiments, the conformal fourth layer 140 may act to seal any defects that may occur in the third layer 130 (also a barrier layer), and any defects that may propagate through the multilayered film assembly 200 at the edge seal locations as a result of the directional coating techniques (e.g., PVD and sputtering) used to deposit the second 120 and third 130 layers.

The material of the fourth layer 140 is not particularly limited, and may be any material known in the field suitable for substantially preventing or reducing the permeation of damaging gases, liquids, and chemicals (e.g., oxygen and water vapor) to a protected device. The fourth barrier layer 140 may be made from the same barrier material as the first 110 and/or third 130 layers, or from a different material. Some non-limiting examples of suitable materials for the fourth layer 140 include metals, metal oxides, metal nitrides, metal oxynitrides, metal carbides, metal oxyborides, and combinations thereof. Those of ordinary skill in the art would be capable of selecting a suitable metal for use in the oxides, nitrides, and oxynitrides based on the desired properties of the layer. However, in some embodiments, for example, the metal may be Al, Zr, Ti, or Si (i.e., aluminum oxides such as $Al_2O_3$, silicon oxides, nitrides, or oxynitrides.

The properties of the fourth layer 140 (e.g., including density, refractive index and thickness) are not particularly limited. In particular, the properties of the fourth layer 140 may take on any value suitable for the layer to function as a barrier layer. As is understood by those of ordinary skill in the art, the values of the properties will vary depending on the material of the layer 140. As such, those of ordinary skill in the art would be capable of determining (or calculating) the appropriate properties of the fourth layer 140 based on the material of the layer.

Figure 9A:
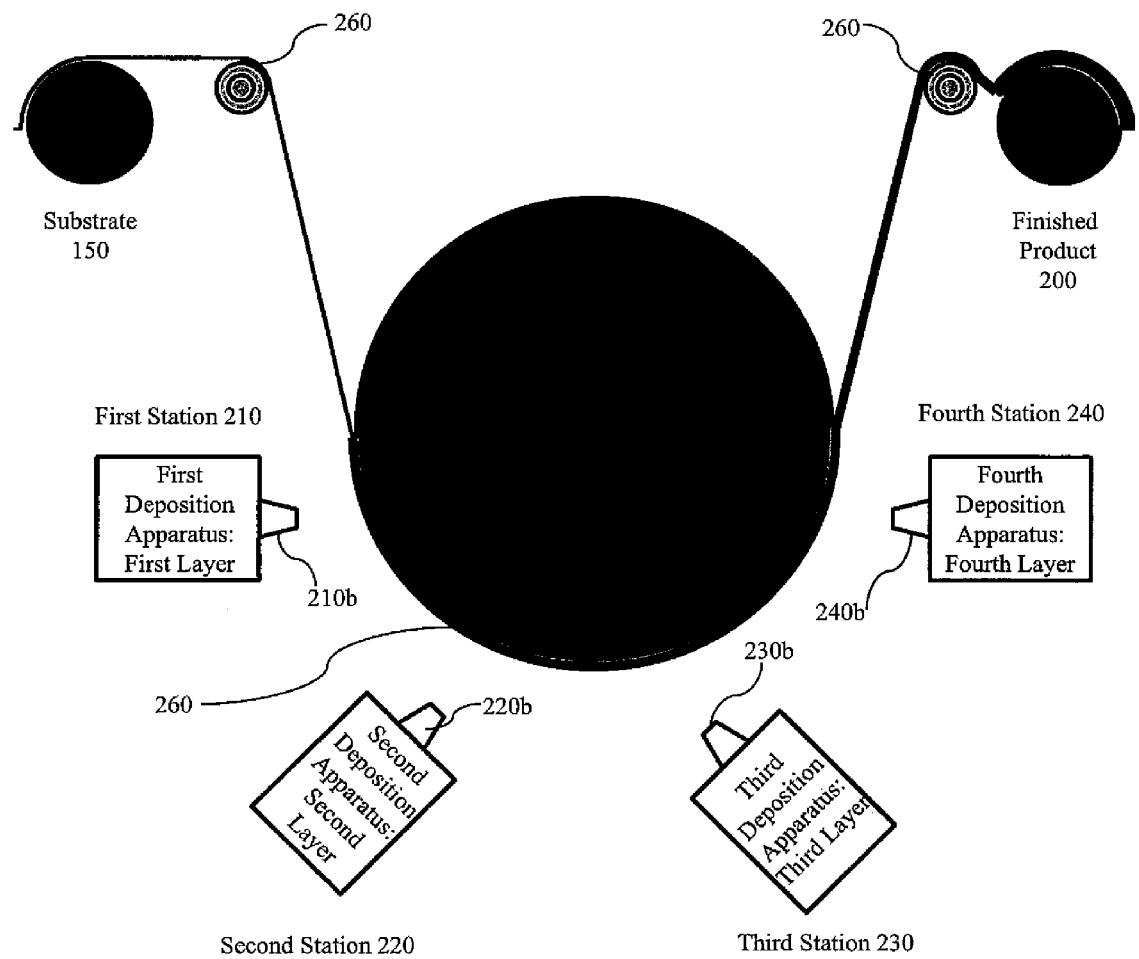
FIG. 9A is a schematic diagram illustrating a system for manufacturing the patterned multilayered stack according to another embodiment of the present invention using roll-to-roll (R2R) processing utilizing multiple deposition stations positioned around one drum (or roller)
Figure 9B:
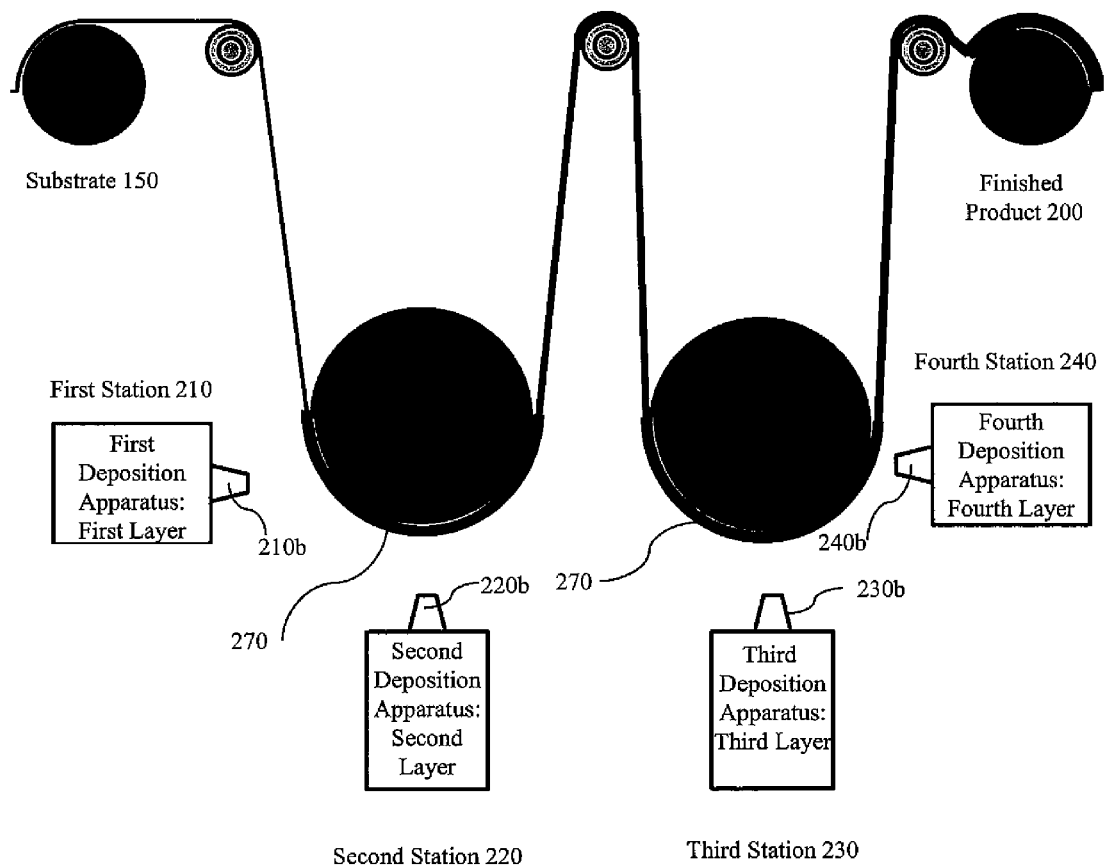
FIG. 9B is a schematic diagram illustrating a system for manufacturing the patterned multilayered stack according to another embodiment of the present invention using roll-to-roll (R2R) processing utilizing multiple deposition stations positioned around more than one drum (or roller), but having fewer drums (or rollers) than stations.

The multilayered film with edge seal 200 described above may be manufactured by any suitable technique using any suitable apparatus or system. In some embodiments, for example, the multilayered film 200 may be made by roll-to-roll (R2R) processing utilizing multiple drums (or rollers) 210a, 220a, 230a, and 240a, one at each respective station 210, 220, 230, and 240, to deposit the multiple layers of the film 110, 120, 130, and/or 140 as generally depicted in FIG. 9. Alternatively, the roll-to-roll processing system may include multiple deposition stations 210, 220, 230, and 240 positioned around one 260 or more drums 270, as generally depicted in FIG. 9A (depicting multiple stations 210, 220, 230, and 240 around one drum 260) and 9B (depicting multiple stations 210, 220, 230, and 240 around more than one drum 270, but having fewer drums 270 than stations 210, 220, 230, and 240). These roll-to-roll (R2R) processing methods enable bulk manufacture of the multilayered film 200, manufacturing flexibility, higher large-scale throughput production, and reduced cost. The method includes moving a substrate or support material 150 through a roll-to-roll processing system having multiple stations 210, 220, 230, and 240. As the substrate 150 moves through each station, a different layer 210, 220, 230, or 240 is deposited on the substrate 150. For example, the roll-to-roll processing system, as generally depicted in FIGS. 9, 9A, and 9B, includes a first station 210 for depositing the first layer 110 on the substrate 150, a second station 220 for depositing the second layer 120 on the first layer 110, and a third station 230 for depositing the third layer 130 on the second layer 120. In embodiments in which the barrier film 200 further includes a fourth layer 140, the roll-to-roll processing system further includes a fourth station 240 for depositing the fourth layer 140 on the third layer 130.

The first station 210 can be configured to deposit the first layer 110 as a continuous layer spanning the entire area of the substrate 150 (as shown generally in the film depicted in FIGS. 1 and 4), or as a continuous layer spanning an area smaller than the area of the substrate 150 (as shown generally in the film depicted in FIGS. 2, 3A and 3B). Alternatively, the first station 210 can be configured to deposit the first layer 110 as a patterned layer, creating discrete areas of film 160 in which the substrate 150 is coated with first layer 110. As discussed above, these discrete areas 160 of first layer 110 are separated from each other by uncoated areas 170 of the substrate 150.

To deposit the first layer 110 on the substrate 150, the first station 210 includes a deposition apparatus 210b which may be positioned around its own first roller (or drum) 210a, as depicted in FIG. 9, or may be positioned around a common roller (or drum) 260 or 270, as depicted in FIG. 9A or 9B. The first roller 210a (or common roller 260 or 270) moves the substrate 150 by (or through) the deposition apparatus 210b, and the deposition apparatus 210b deposits the material of the first layer 110 on the substrate 150 as it moves by or through the deposition apparatus 210b. The deposition apparatus 210b may be any suitable apparatus for depositing the material of the first layer 110 on the substrate 150. As would be understood by those of ordinary skill in the art, the construction of the deposition apparatus 210b will depend on the method of deposition used to deposit the first layer 110. In some embodiments, for example, the deposition apparatus 210b may be configured to sputter the deposition material on the substrate 150. The deposition apparatus 210b may be configured with a slit (or other patterned output) through which the deposition material exits the apparatus 210b and is deposited on the substrate 150. Although the deposition apparatus 210b of the first station 210 is described here as a sputtering apparatus, those of ordinary skill in the art would recognize that any suitable deposition apparatus 210b could be used to deposit the first layer 110, and the present invention is not limited to sputtering apparatuses.

In embodiments in which the first layer 110 is a continuous layer (either spanning the entire area or a smaller area of the substrate 150), the deposition apparatus 2101 is configured to continually output the deposition material. However, in embodiments in which the first layer 110 is a patterned layer, the first station 210 may further include a shutter 420 in front of or attached to the deposition apparatus 210b (for example, the shutter 420 shown in FIGS. 10 and 11). The shutter 420 is configured to open 430 and close 440 at specified intervals so that the deposition apparatus 210b will deposit the material of the first layer 110 while the shutter 420 is opened 430, and not deposit the material while the shutter 420 is closed 440. This configuration results in a substrate 150 with a patterned first layer 110 in which the substrate 150 includes discrete areas 160 of first layer 110 separated by uncoated areas 170 of substrate 150.

Alternatively, the first station 210 may include a mask 320 placed in front of or attached to the deposition apparatus 210b (e.g., spaced apart bars). The mask 320 creates areas on the substrate 150 where the deposition material is not deposited (i.e., corresponding to the position of the solid portions of the mask 320) and areas on the substrate 150 where the deposition material is deposited (i.e., corresponding to the open portions of the mask 320). The mask 320 may have any shape, one non-limiting example of which is the bars depicted in the drawings (for example, as shown in FIG. 10). An alternative to the bars, however, may be a grid-shaped mask, which would result in smaller, discrete sections of the substrate coated with the first layer. Also, the mask 320 may be used in combination with the shutter 420 discussed above to achieve a similar result, i.e., a grid patterned first layer 110 on the substrate 150.

The second station 220 is downstream from the first station 210 and is configured to deposit the second layer 120 as a patterned layer on the first layer 110 spanning a smaller area than the first layer 110. To deposit the second layer 120 on the first layer 110, the second station 220 includes a second deposition apparatus 220b which may be positioned around its own second roller (or drum) 220a, as depicted in FIG. 9, or may be positioned around a common roller (or drum) 260 or 270, as depicted in FIG. 9A or 9B. The second roller 220a (or common roller 260 or 270) allows the substrate 150 (coated with the first layer 110) to pass by (or through) the second deposition apparatus 220b, and the second deposition apparatus 220b deposits the material of the second layer 120 on the first layer 110 as it moves by or through the second deposition apparatus 220b. The second deposition apparatus 220b may be any suitable apparatus for depositing the material of the second layer 120 on the first layer 110. As would be understood by those of ordinary skill in the art, the construction of the second deposition apparatus 220b will depend on the method of deposition used to deposit the second layer 120. In some embodiments, for example, the deposition apparatus 220b may be a flash evaporator 520 (as shown in FIG. 10, for example). This deposition apparatus 520 may be configured with a slit (or other patterned output) 510 through which the deposition material exits the apparatus 520 and is deposited on the first layer 110. Other non-limiting examples of suitable deposition apparatuses 220b include slot die coaters and ink jet printers. Also, while certain exemplary deposition apparatuses 220b are described and referenced here, those of ordinary skill in the art would recognize that any suitable deposition apparatus 220b could be used.

To create the pattern of the second layer 120, the second station 220 may further include a shutter 420 in front of or attached to the second deposition apparatus 220b. The shutter 420 is configured to open 430 and close 440 at specified intervals so that the second deposition apparatus 220b will deposit the material of the second layer 120 while the shutter is opened 430, and not deposit the material while the shutter is closed 440. This configuration results in a patterned second layer 120 including discrete areas 160 of second layer 120. In embodiments in which the first layer 110 was deposited as a pattern, the shutter 420 intervals are selected such that the second layer 120 is deposited on the areas of the substrate 150 where the first layer 110 has been deposited. Also, the shutter 420 intervals used to deposit the second layer 120 are selected such that the second layer 120 is deposited on a smaller area than the area of the first layer 110 to thereby create a patterned film in which the discrete areas 160 of first layer 110 include smaller discrete areas of second layer 120, as generally depicted in FIG. 5.

Alternatively, the second station 220 may include a mask 320 placed in front of or attached to the second deposition apparatus 210b (e.g., spaced apart bars). The mask 320 creates areas on the first layer 110 where the deposition material is not deposited (i.e., corresponding to the position of the solid portions of the mask 320) and areas on the first layer 110 where the deposition material is deposited (i.e., corresponding to the open portions of the mask 320). The mask 320 may have any shape, one non-limiting example of which is the bars depicted in the drawings (for example, as shown in FIG. 10). An alternative to the bars, however, may be a grid-shaped mask 320, which would result in smaller, discrete sections 160 of the first layer 110 coated with the second layer 120. Also, the mask 320 may be used in combination with the shutter 420 discussed above (and in FIG. 10) to achieve a similar result, i.e., a grid patterned second layer 120 on the first layer 110. Whichever of the mask 320, shutter 420, or combination thereof is used to create the patterned second layer 120, the mask 320 and/or shutter 420 intervals are selected such that the second layer 120 is deposited on the continuous or patterned first layer 110 to span an area smaller than the area spanned by the first layer 110. For example, if a mask 320 is used to create both the first layer 110 and the second layer 120, the mask 320 used to deposit the second layer 120 will generally have a larger solid area so that the second layer 120 is deposited on the first layer 110 but covers a smaller area than the first layer 110. Similarly, if a shutter 420 is used to create both the first 110 and second 120 layers, the shutter 420 interval during which the shutter 420 will remain opened 430 will start later, be shorter, and end earlier than the shutter 420 interval used to deposit the first layer 110.

Additionally, in embodiments where the deposition apparatus 220b is a slot die coater, the die coater can be configured with obstructions placed to block the flow of the deposition material in the travel direction. In this configuration, the slot die coater will deposit material only in the spaces between the obstructions. Also, to create further patterns, the flow of the die coater can be started and stopped at desired intervals to create the desired pattern. This configuration is similar to the shutter 420 configuration described above. However, the nature of the die coater apparatus allows for the starting and stopping of flow, thereby eliminating the need for a separate shutter 420.

In embodiments where the deposition apparatus 220b is an ink jet printer, the printer can be used to form any pattern of any shape, as would be recognized by those of ordinary skill in the art.

The third station 230 is downstream from the second station 220 and can be configured to deposit the third layer 130 as a continuous layer spanning the entire area of the substrate 150 (i.e., covering the patterned second layer 120, the continuous or patterned first layer 110, and the substrate 150, as shown generally in the film 200 depicted in FIGS. 1 and 4), or as a continuous layer spanning an area smaller than the area of the substrate 150 (i.e., covering the patterned second layer 120, the continuous or patterned first layer 110, and the substrate 150, as shown generally in the film 200 depicted in FIGS. 2, 3,A and 3B). Alternatively, the third station 230 can be configured to deposit the third layer 130 as a patterned layer.

To deposit the third layer 130 on the substrate 150 (i.e., covering the second layer 120, at least a portion of the first layer 110, and at least a portion of the substrate 150), the third station 230 includes a third deposition apparatus 230b which may be positioned around its own third roller (or drum) 230a, as depicted in FIG. 9, or may be positioned around a common roller (or drum) 260 or 270, as depicted in FIG. 9A or 9B. The third roller 230a (or common roller 260 or 270) moves the substrate 150 (coated with the first 110 and second 120 layers) by (or through) the third deposition apparatus 230b, and the third deposition apparatus 230b deposits the material of the third layer 130 on the substrate 150 as it moves by or through the third deposition apparatus 230b. The third deposition apparatus 230b may be any suitable apparatus for depositing the material of the third layer 130 on the substrate 150. As would be understood by those of ordinary skill in the art, the construction of the third deposition apparatus 230b will depend on the method of deposition used to deposit the third layer 130. In some embodiments, for example, the deposition apparatus 230b may be configured to sputter the material of the third layer 130. The third deposition apparatus 230b may be configured with a slit (or other patterned output) through which the deposition material exits the apparatus 230b and is deposited on the substrate 150 (coated with the first 110 and second 120 layers).

In embodiments in which the third layer 130 is a continuous layer (either spanning the entire area or a smaller area of the coated substrate 150), the third deposition apparatus 230b is configured to continually output the deposition material. However, in embodiments in which the third layer 130 is a patterned layer, the third station 230 may further include a shutter 420 in front of or attached to the third deposition apparatus 230b. The shutter 420 is configured to open 430 and close 400 at specified intervals so that the third deposition apparatus 230b will deposit the material of the third layer 130 while the shutter 420 is opened 430, and not deposit the material while the shutter 420 is closed 440. This configuration results in a coated substrate 150 with a patterned third layer 130.

Alternatively, the third station 230 may include a mask 320 placed in front of or attached to the third deposition apparatus 230b (e.g., spaced apart bars). The mask 320 creates areas on the coated substrate 150 where the deposition material is not deposited (i.e., corresponding to the position of the solid portions of the mask 320) and areas on the substrate 150 where the deposition material is deposited (i.e., corresponding to the open portions of the mask 320). The mask 320 may have any shape, one non-limiting example of which is the bars depicted in the drawings. An alternative to the bars, however, may be a grid-shaped mask 320, which would result in smaller, discrete sections 160 of the coated substrate 150 coated with the third layer 130. Also, the mask 320 may be used in combination with the shutter 420 discussed above (and as shown in FIG. 10, for example) to achieve a similar result, i.e., a grid patterned third layer 130 on the coated substrate 150.

In embodiments in which the third layer 130 is different from the first layer 110 (e.g., when the first layer 110 is patterned and the third layer 130 is continuous, or when the first layer 110 is continuous and the third layer 130 is patterned, or when the first layer 110 includes a material different than the material of the third layer 130), the roll-to-roll processing system may include the third station 230 described above. However, when the first 110 and third layers 130 are the same (i.e., both layers 110 and 130 include the same material, and the layers 110 and 130 are either both continuous or both patterned in the same way), the third station 230 may be eliminated, and the third layer 130 may be deposited by reversing the direction of the roll-to-roll processing system after deposition of the second layer 120. In such a configuration, after deposition of the second layer 120, the second deposition apparatus 220b is turned off, and the direction of the rollers 210a and 220a, or 260, or 270, is reversed such that the coated substrate 150 (i.e., the substrate 150 coated with the first 110 and second 120 layers) is passed by (or through) the first deposition apparatus 210b a second time. During the second pass by (or through) the first deposition apparatus 210b, the third layer 130 is deposited on the coated substrate 150 in the same manner and to the same specifications as the first layer 110.

Also, even in embodiments in which the first 110 and third 130 layers are different in some way (e.g., by being different materials or being patterned in a different manner), the first station 210 may be used to deposit both layers 110 and 130. In particular, the rollers 210a and 220a, or 260, or 270, may be reversed after deposition of the second layer 120, as discussed above, and the coated substrate 150 (i.e., coated with the first 110 and second 120 layers) may be passed by (or through) the first station 210 a second time to deposit the third layer 130. However, before the coated substrate 150 is passed through the first station 210 for the second time, the first station 210 is re-programmed (e.g., manually or automatically) to deposit the third layer 130. The re-programming alters the specifications of the first station 210 from those used to deposit the first layer 110 to those needed to deposit the third layer 130. For example, in embodiments in which the first layer 110 is a blanket layer and the third layer 130 is patterned, the re-programming may including programming the first station 210 to turn on a shutter 420 or deploy a mask 320. Also, in embodiments in which the first 110 and third 130 layers include different materials, the re-programming may include programming the first station 210 to use different starting (e.g., sputtering) materials. Those of ordinary skill in the art would be capable of making the appropriate adjustments to the first station 210 to effect deposition of the desired third layer 130.

In embodiments in which a fourth layer 140 is deposited, the roll-to-roll processing system may further include a fourth station 240. In embodiments including the third station 230, the fourth station 240 is downstream of the third station 230. However, in embodiments in which the third station 230 is omitted, the fourth station 240 is downstream from the first station 210, such that after deposition of the third layer 130 at the first station 210, the coated substrate 150 (i.e., coated with the first 110, second 120, and third 130 layers) continues moving in the reverse direction, but is directed to the fourth station 240. The fourth station 240 may be configured to deposit the fourth layer 140 as a continuous layer spanning the entire area of the substrate 150 (i.e., covering the third layer 130, the patterned second layer 120, the continuous or patterned first layer 110, and the substrate 150, as shown generally in the film 200 depicted in FIG. 4), or as a continuous layer spanning an area smaller than the area of the substrate 150 (i.e., covering the third layer 130, the patterned second layer 120, the continuous or patterned first layer 110, and the substrate 150). Alternatively, the fourth station 240 can be configured to deposit the fourth layer 140 as a patterned layer.

To deposit the fourth layer 140 on the substrate 150 (i.e., covering the third layer 130, the second layer 120, at least a portion of the first layer 110, and at least a portion of the substrate 150), the fourth station 240 includes a fourth deposition apparatus 240b which may be positioned around its own fourth roller (or drum) 240a, as depicted in FIG. 9, or may be positioned around a common roller (or drum) 260 or 270, as depicted in FIG. 9A or 9B. The fourth roller 240a (or common roller 260 or 270) moves the substrate 150 (coated with the first 110, second 120, and third 130 layers) by (or through) the fourth deposition apparatus 240b, and the fourth deposition apparatus 240b deposits the material of the fourth layer 140 on the substrate 150 as it moves by or through the fourth deposition apparatus 240b. The fourth deposition apparatus 240b may be any suitable apparatus for depositing the material of the fourth layer 140 on the substrate 110. As would be understood by those of ordinary skill in the art, the construction of the fourth deposition apparatus will depend on the method of deposition used to deposit the fourth layer 140. In some embodiments, for example, the deposition apparatus 240b may be configured for chemical vapor deposition or atomic layer deposition. The fourth deposition apparatus 240b may be configured with a slit or other patterned output (where applicable) through which the deposition material exits the apparatus and is deposited on the substrate 150 (coated with the first 110, second 120, and third 130 layers).

In embodiments in which the fourth layer 140 is a continuous layer (either spanning the entire area or a smaller area of the coated substrate 150), the fourth deposition apparatus 240*b* is configured to continually output (or otherwise deposit) the deposition material. However, in embodiments in which the fourth layer 140 is a patterned layer, the fourth station 240 may further include a shutter 420 in front of or attached to the fourth deposition apparatus 240*b*. The shutter 420 is configured to open 430 and close 440 at specified intervals so that the fourth deposition apparatus 240*b* will deposit the material of the fourth layer 140 while the shutter 420 is opened 439, and not deposit the material while the shutter 420 is closed 440. This configuration results in a coated substrate 150 with a patterned fourth layer 140.

Alternatively, the fourth station 240 may include a mask 320 placed in front of or attached to the fourth deposition apparatus 240*b* (e.g., spaced apart bars). The mask 320 creates areas on the coated substrate 150 where the deposition material is not deposited (i.e., corresponding to the position of the solid portions of the mask 320) and areas on the substrate 150 where the deposition material is deposited (i.e., corresponding to the open portions of the mask 320). The mask 320 may have any shape, one non-limiting example of which is the bars depicted in the drawings. An alternative to the bars, however, may be a grid-shaped mask 320, which would result in smaller, discrete sections 160 of the coated substrate 150 coated with the fourth layer 140. Also, the mask 320 may be used in combination with the shutter 420 discussed above (and shown in FIG. 10, for example) to achieve a similar result, i.e., a grid patterned fourth layer 140 on the coated substrate 150.

In embodiments in which the fourth layer 140 is different from the first layer 110 (e.g., when the first layer 110 is patterned and the fourth layer 140 is continuous, or when the first layer 110 is continuous and the fourth layer 140 is patterned, or when the first layer 110 includes a material different than the material of the fourth layer 140), the roll-to-roll processing system may include the fourth station 240 described above. However, when the first 110 and fourth 140 layers are the same (i.e., both layers 110 and 140 include the same material, and the layers 110 and 140 are either both continuous or both patterned in the same way), the fourth station 240 may be eliminated, and the fourth layer 140 may be deposited by reversing the direction of the roll-to-roll processing system after deposition of the third layer 130. In such a configuration, after deposition of the third layer 130, the second 220*b* and third 230*b* deposition apparatuses are turned off, and the direction of the rollers 210*a* and 220*a*/230*a*, or 260, or 270 is reversed such that the coated substrate 150 (i.e., the substrate 150 coated with the first 110, second 120, and third 130 layers) is passed by (or through) the first deposition apparatus 210*b* a third (or second) time. During the third (or second) pass by (or through) the first deposition apparatus 210, the fourth layer 140 is deposited on the coated substrate 150 in the same manner and to the same specifications as the first layer 110 (and the third layer 130, in embodiments where the first layer 110 and the third layer 130 are deposited by the first deposition apparatus 210*b*). Accordingly, in embodiments in which the first 110, third 130, and fourth 140 layers are all the same, both the third 230 and fourth 240 stations may be eliminated, and after the second pass by (or through) the first deposition apparatus 210*b* to deposit the third layer 130, the direction of the rollers 210*a* and 220*a*, or 260, or 270 is reversed a second time such that the coated substrate 150 (i.e., coated with the first 110, second 120 and third 130 layers) is passed by (or through) the first deposition apparatus 210*b* a third time, during which third pass the fourth layer 140 is deposited.

Also, even in embodiments in which the first 110 (and/or third 130) and fourth 140 layers are different in some way (e.g., by being different materials or being patterned in a different manner), the first station 210 or third station 230 (when present) may be used to deposit both layers (i.e., the first 110 and fourth 140 layers when the first station 210 is used, or third 130 and fourth 140 layers when the third station 230 is used). In particular, the rollers 210*a*, 220*a*, and/or 230*a*, or 260, or 270 may be reversed after deposition of the third layer 130, as discussed above, and the coated substrate 150 (i.e., coated with the first 110, second 120, and third 130 layers) may be passed by (or through) the first station 210 a second (or third) time to deposit the fourth layer 140. Similarly, when a third station 230 is present, the coated substrate 150 may be passed through the third station 230 a second time to deposit the fourth layer 140. However, before the coated substrate 150 is passed through the first station 210 for the second or third time (or the third station 230 for the second time), the first station 210 or third station 230 is re-programmed (e.g., manually or automatically) to deposit the fourth layer 140. The re-programming alters the specifications of the first station 210 or third station 230 from those used to deposit the first 110 (and/or third 130) layer to those needed to deposit the fourth layer 140. For example, in embodiments in which the first 110 (and/or third 130) layer is a blanket layer and the fourth layer 140 is patterned, the re-programming may include programming the first 210 (or third 230) station to turn on a shutter 420 or deploy a mask 320. Also, in embodiments in which the first 110 (and/or third 130) and fourth 140 layers include different materials, the re-programming may include programming the first 210 (or third 230) station to use different starting (e.g., sputtering) materials. Those of ordinary skill in the art would be capable of making the appropriate adjustments to the first 210 or third 230 station to effect deposition of the desired fourth layer 140.

Figure 12:
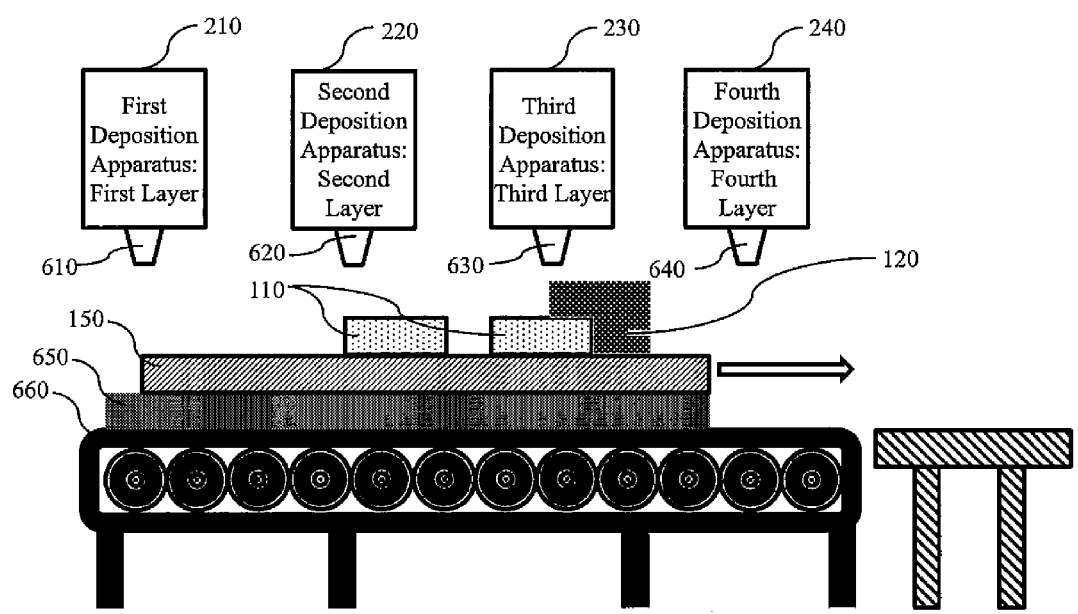
FIG. 12 is a schematic diagram illustrating a system for manufacturing the patterned multilayered stack according to another embodiment of the present invention using a batch-type process.

As noted above, the patterned multilayered sheet 200 described above may be made by any suitable method. As such, although the roll-to-roll process described above is one exemplary method of manufacturing the patterned multilayered sheet 200, the sheet 200 may be made by any other suitable method. For example, in some embodiments, instead of the roll-to-roll process, the patterned multilayered sheet may be made using a batch-type process (also referred to herein as a "batch-style process" or simply a "batch process"), illustrated generally in FIG. 12. In such a batch-type process, the system used to manufacture the patterned multilayered sheet 200 is similar to the apparatus used in the roll-to-roll process, except that the batch-type system does not include rollers at each station. In particular, as in the roll-to-roll system, the batch-style system also includes the above described first 210 and second 220 stations (and optionally the third 230 and/or fourth 240 stations) for depositing the layers 110, 120, 130, and/or 140 of the patterned multilayered sheet 200. With the exception of omitting the rollers described in connection with the first through fourth stations 210 through 240 of the roll-to-roll system, the first through fourth stations 210 through 240 used in the batch process are the same as those described with respect to the roll-to-roll process. To facilitate transfer of the sheet 200 from station to station in the batch-style process, the substrate 150 (on which the layers 110, 120, 130, and 140 of the patterned multilayered sheet 200 are deposited) is supported on a cattier 650. The carrier 650 can be any suitable material, for example a generally rigid material. In some embodiments, for example, the carrier 650 is a glass or generally rigid plastic carrier. The carrier 650 enables the stable and easy transfer of the substrate 150 and the subsequently deposited layers 110, 120, 130, and 140 from station to station (from 210, 220, 230, or 240) during the batch-style manufacturing process. To facilitate easy removal of the coated substrate 150 after completion of the batch process, the uncoated side of the substrate 150 may include a release liner, e.g., a silicone release liner.

The substrate 150 on the carrier 650 may be moved from station to station (from 210 to 240) in the batch-style process by any suitable method. For example, in one embodiment, the stations 210, 220, 230, and/or 240 of the batch-style system are positioned generally linearly along a travel path of a conveyor belt 660 (or similar device), and the carrier 650/substrate 150 is placed on the conveyor belt 660. As the conveyor belt 660 moves, the carrier 650/substrate 150 is moved from station to station (210 to 240) on the conveyor belt 660. In this embodiment, the substrate 150 is moved into the first station 210 by the conveyor belt 660, which then stops movement until after completion of deposition of the first layer 110. In such embodiments (i.e., in which the conveyor belt 660 stops movement to allow for deposition of the first layer 110), the deposition apparatus 610 need not be specially configured to deposit the first layer 110 on a moving target, as described above with respect to the roll-to-roll process. Specifically, the first station 210 need not include the slit (or other patterned output), but rather can be a standard deposition apparatus 610 modified only to accommodate the conveyor belt 660. Alternatively, the first station 210 can be configured as described above to deposit the first layer 110 on a moving target, and instead of halting movement upon reaching the first station 210, the conveyor belt 660 can continue to move the substrate 150 through the stations 210, 220, 230, and/or 240. In these embodiments, the batch process deposits the first layer 110 in much the same manner as the roll-to-roll process. More specifically, the first layer 110 is deposited through a slit (or other patterned output) in the deposition apparatus 610 of the first station 210 as the carrier 650 and substrate 150 pass through the first station 210 on the conveyor belt 660.

After the deposition in the first station 210 is completed, the conveyor belt 660 moves the substrate 150 to the second station 220. Similar to the deposition of the first layer 110, the conveyor belt 660 may either stop moving once the carrier 650 and substrate 150 reach the second station 220, or the conveyor belt 660 may continue to move the carrier 650 and substrate 150 through the second station 220 as deposition occurs. As also described above with respect to the first station 210, when the conveyor belt 660 stops moving the carrier 650 and substrate 150 upon reaching the second station 220, the deposition apparatus 620 of the second station 220 need not be specially configured to deposit the second layer 120 on the substrate 150. Rather, the deposition apparatus 620 may be a standard deposition apparatus 620 modified only to accommodate the conveyor belt 660. Alternatively, the second station 220 can be configured as described above with respect to the roll-to-roll process to deposit the second layer 120 on a moving target, and instead of halting movement upon reaching the second station 220, the conveyor belt 660 can continue to move the carrier 650 and substrate 150. In these embodiments, the batch process deposits the second layer 120 in much the same manner as the roll-to-roll process. More specifically, the second layer 120 is deposited through a slit (or other patterned output) in the deposition apparatus 620 of the second station 220 as the carrier 650 and substrate 150 pass through the second station 220 on the conveyor belt 660.

After deposition in the second station 220 is completed, the conveyor belt 660 can either continue moving the substrate 150 in the same direction toward a third station 230, or the conveyor belt 660 can move the substrate 150 in the reverse direction to direct the substrate 150 back to the first station 210. The existence or omission of the third station 230 is discussed in detail above with respect to the roll-to-roll process, and that discussion is also relevant and applicable in the batch process embodiments, and will not be repeated here. In embodiments including a third station 230, the conveyor belt 660 may either stop moving once the carrier 650 and substrate 150 reach the third station 230, or the conveyor belt 660 may continue to move the carrier 650 and substrate 150 through the third station 230 as deposition occurs. As also described above with respect to the first 210 and second 220 stations, in embodiments in which the conveyor belt 660 stops moving the carrier 650 and substrate 150 upon reaching the third station 230, the deposition apparatus 630 of the third station 230 need not be specially configured to deposit the third layer 130 on the substrate 150. Rather, the deposition apparatus 630 may be a standard deposition apparatus 630 modified only to accommodate the conveyor belt 660. Alternatively, the third station 230 can be configured as described above with respect to the roll-to-roll process to deposit the third layer 130 on a moving target, and instead of halting movement upon reaching the third station 230, the conveyor belt 660 can continue to move the carrier 650 and substrate 150. In these embodiments, the batch process deposits the third layer 130 in much the same manner as the roll-to-roll process. More specifically, the third layer 130 is deposited through a slit (or other patterned output) in the deposition apparatus 620 of the third station 230 as the carrier 650 and substrate 150 pass through the third station 230 on the conveyor belt 660.

In embodiments in which the third station 230 is omitted, the conveyor belt 660 reverses direction after completion of deposition of the second layer 120 and returns the carrier 650 and substrate 150 to the first station 210. As described above with respect to the roll-to-roll process, the first station 210 may either remain the same as it was for deposition of the first layer 110 or may be re-programmed to deposit a different layer 130 (e.g., a layer of a different material or a layer with a different pattern). Again, the conveyor belt 660 may either stop movement of the carrier 650 and substrate 150 upon reaching the first station 201 for the second time, or may continue to move the carrier 650 and substrate 150 through the first station 210 during deposition of the third layer 130.

After deposition in the third station 230 (or second pass through the first station 210) is completed, the conveyor belt 660 can either continue moving the substrate 150 in the same direction (either forward or reverse depending on the presence of a third station 230) toward a fourth station 240 (i.e., the forward direction when a third station 230 is present, or the reverse direction when the third station 230 is omitted), or the conveyor belt 660 can move the substrate 150 in the opposite direction (i.e., either forward or reverse depending on the presence of a third station 230) to direct the substrate 150 back to the third station 230 or first station 210. The existence or omission of the third 230 and fourth 240 stations is discussed in detail above with respect to the roll-to-roll process, and that discussion is also relevant and applicable in the batch process embodiments, and will not be repeated here. In embodiments including a third station 230, the conveyor belt 660 can move the carrier 650 and substrate 150 to the fourth station 240, move the carrier 650 and substrate 150 in the opposite direction back to the third station 230 (when the system does not include a fourth station 240), or not move the carrier 650 and substrate 150 at all and leave the carrier 650 and substrate 150 in the third station 230 for a second deposition procedure (when the system does not include a fourth station 240). In embodiments in which the third station 230 is omitted and the third layer 130 is deposited by the first station 210, the conveyor belt 660 can move the carrier 650 and substrate 150 to the fourth station 240 from the first station 210, move the carrier 650 and substrate 150 in the opposite direction back to the first station 210 (when the system does not include a fourth station 240 and when the conveyor belt 660 continues to move the substrate 650 during deposition), or not move the carrier 650 and substrate 150 at all and leave the carrier 650 and substrate 150 in the first station 210 for another deposition procedure (when the system does not include a fourth station 240). As described above with respect to the roll-to-roll process, the first 210 or third 230 station may either remain the same as it was for deposition of the first 110 or third 130 layer or may be re-programmed to deposit a different layer 140 (e.g., a layer of a different material or a layer with a different pattern).

In embodiments including a fourth station 240, the conveyor belt 660 may either stop moving once the carrier 650 and substrate 150 reach the fourth station 240, or the conveyor belt 660 may continue to move the carrier 650 and substrate 150 through the fourth station 240 as deposition occurs. As also described above with respect to the first 210, second 220, and third 230 stations, in embodiments in which the conveyor belt 660 stops moving the carrier 650 and substrate 150 upon reaching the fourth station 240, the deposition apparatus 640 of the fourth station 240 need not be specially configured to deposit the fourth layer 140 on the substrate 150 Rather; the deposition apparatus 640 may be a standard deposition apparatus 640 modified only to accommodate the conveyor belt 660. Alternatively, the fourth station 240 can be configured as described above with respect to the roll-to-roll process to deposit the fourth layer 140 on a moving target, and instead of halting movement upon reaching the fourth station 240, the conveyor belt 660 continues to move the carrier 650 and substrate 150. In these embodiments, the batch process deposits the fourth layer 140 in much the same manner as the roll-to-roll process. More specifically, the fourth layer 140 is deposited through a slit (or other patterned output) in the deposition apparatus 640 of the fourth station 240 as the carrier 650 and substrate 150 pass through the fourth station 240 on the conveyor belt 660.

In alternative embodiments of the batch process (referred to herein as a "cluster batch process" or "cluster batch system"), as shown generally in FIG. 13, the stations 210, 220, 230, and 240 of the batch system are separate and not necessarily positioned along the path of a conveyor belt 660 or similar movement device. Indeed, the stations 210, 220, 230, and 240 need not be positioned in any particular order. In these embodiments, the carrier 650 and substrate 150 are moved from station to station (210 to 240) manually or automatically, e.g., by a robot 750. In such embodiments, the carrier 650 and substrate 150 may be assembled by the robot 750 and then placed in the first station 210 by the robot 750. After deposition of the first layer 110 in the first station 210, the carrier 650 and substrate 150 are moved to the second station 220 for deposition of the second layer 120. After deposition of the second layer 120, the carrier 650 and substrate 150 are moved either to the third station 230 or back to the first station 210 (in embodiments in which the third station 230 is omitted) for deposition of the third layer 130. After deposition of the third layer 130, the carrier 650 and substrate 150 are moved to the fourth station 240, kept in the third station 230 (in embodiments in which the fourth station 240 is omitted), moved to the first station 110 (in some embodiments including a third station 230 but not a fourth station 240, and in which the fourth layer 140 is more similar to the first layer 110), or kept in the first station 110 (in embodiments in which the third 230 and fourth 240 stations are omitted).

In embodiments of the cluster batch system including the separate stations 210, 220, 230, and/or 240 without the conveyor belt 660, the carrier 650 and substrate 150 remain in the deposition apparatus 710, 720, 730, or 740 at each station 210, 220, 230, or 240 until deposition of the subject layer 110, 120, 130, or 140 is complete. In these embodiments, depending on the deposition apparatus 710, 720, 730, or 740 at each station 210, 220, 230, or 240, the carrier 650 and substrate 150 may not be moved through the stations 210, 220, 230, and/or 240 and therefore the deposition apparatuses 710, 720, 730, and 740 at each station 210, 220, 230, and 240 need not be specially configured to accommodate deposition on a moving target, and need not be specially configured to accommodate a conveyor belt 660 or similar device. Instead, as described above, the carrier 650 and substrate 150 are moved from station to station (210 to 240) using a robot 750 programmed to move the carrier 650 and substrate 150 in a particular order (e.g., from the first station 210 to the second station 220 to the third station 230, or from the first station 210 to the second station 230 and back to the first station 210). Also, as described above with respect to the roll-to-roll and conveyor belt processes, the first 210 and/or third 230 stations can be re-programmed after deposition of the first 110 and/or third layers 130 to accommodate the later deposition of the third 130 and/or fourth 140 layers in the same deposition apparatus 710 and/or 730.

As discussed above, in the cluster batch system, the deposition apparatuses 710, 720, 730, or 740 at each station 210, 220, 230, or 240 need not be specially configured for deposition on a moving target. However, as would be understood by those of ordinary skill in the art, certain deposition apparatuses 710, 720, 730, and/or 740 rely on such movement through the apparatus 710, 720, 730, and/or 740 or by a particular component of the apparatus (such as, for example, a slot). In particular, while certain deposition apparatuses run a deposition process that does not require substrate scanning (e.g., PECVD and ink jet printing where the substrate is stationary and the deposition technique coats the substrate uniformly), other apparatuses use a substrate scanning mechanism (e.g., an individual substrate scanning mechanism). For example, both sputtering and flash evaporation rely on substrate scanning for deposition. When the deposition apparatus 710, 720, 730, and/or 740 in a station 210, 220, 230, and/or 240 of the cluster batch system includes an apparatus 710, 720, 730, and/or 740 that relies on substrate scanning, the substrate 150/carrier 650 is placed in the apparatus 710, 720, 730, or 740 (e.g., by a robot 750) and the substrate 150/carrier 650 then travels past the linear deposition source (e.g., a slot) to coat the substrate 150. Upon being placed in the apparatus 710, 720, 730, or 740, the substrate 150/carrier 650 can be fitted with a mask 320 that is removed after deposition, as discussed further below.

In addition to apparatuses employing linear deposition sources (e.g., sputtering and flash evaporation), some deposition apparatuses rely on rotational movement of the substrate 150/carrier 650 for deposition. For example, in certain deposition apparatuses (e.g., evaporation apparatuses such as thermal evaporators, e-beam evaporators, etc.), the substrate 150/carrier 650 rotates during deposition to achieve uniform deposition. When the deposition apparatus 710, 720, 730, or 740 in a station 210, 220, 230, or 240 of the cluster batch system includes an apparatus 710, 720, 730, or 740 that relies on substrate 150 rotation, the substrate 150/carrier 650 is placed in the apparatus (e.g., by a robot 750) and the substrate 150/carrier 650 then begins to rotate. After deposition is complete, the substrate 150 stops rotating and is removed from the apparatus. Upon being placed in the apparatus, the substrate 150/carrier 650 can be fitted with a mask 320 that is removed after deposition, as discussed further below.

In either of the batch-style processes (e.g., the conveyor belt 660 or the robot 750—or manual—embodiments), the stations 210, 220, 230, and 240 may be configured to automatically deploy a mask 320 (when needed to create a pattern) on the substrate 150 upon entry of the substrate 150 into the station 210, 220, 230, or 240. The stations 210, 220, 230, and 240 may also be configured to remove the mask 320 after completion of the deposition procedure and prior to removal of the carrier 650 and substrate 150 from the station 210, 220, 230, or 240. This automatic masking works particularly well for the robot 750 (or manual) embodiments and for the conveyor belt 660 embodiments in which the conveyor belt 660 stops movement when the carrier 650 and substrate 150 reach each station 210, 220, 230, and 240. In the conveyor belt 660 embodiments in which the conveyor belt 660 continues to move the carrier 650 and substrate 150 through the stations 210, 220, 230, and 240 during deposition, however, the stations 210, 220, 230, and 240 are not configured to deploy a mask 320 on the substrate 150 and later remove the mask 320. Rather, in these embodiments, the mask 320 is placed in front of the slit (or other output), and further patterning may be achieved using a shutter 420, as described above with respect to the roll-to-roll processing system of FIG. 10. After completion of the batch process, the substrate 150 is removed from the carrier 650 via the release liner.

After completing the above described passes through the first 210, second 220, third 230 and/or fourth 240 stations (and in the batch processes, after removal of the substrate 150 from the carrier 650), a bulk sheet or roll of the multilayered film 200 is created. The bulk sheet or roll of the multilayered film 200 may then be cut between the patterned decoupling layer 120 areas to yield individual units 100 for encapsulation or lamination of an OLED device or the like. Because the decoupling layer 120 is patterned in the bulk sheet 200 leaving spaces 170 between the areas of decoupling layer 120, cutting between the patterned portions of the film 200 does not compromise or damage the edge seal around each portion of the decoupling layer 120. The processes and systems described herein allow for easy and continuous fabrication of a patterned multilayer film 200 with edge seal that can be cut-to-size for encapsulation or lamination of a device to be protected (e.g., an OLED or the like).

The Examples and Comparative Example described below are provided for illustrative purposes only, and do not limit the present disclosure. In the Examples, techniques for creating a pattern of confined areas of polymer sealed between inorganic layers or barrier layers using a masking technique were evaluated for size and quality of the edge seal created around each confined area of polymer. In the Comparative Example, degradation and moisture permeation through a barrier film assembly having a patterned polymer layer deposition as described in embodiments of the present invention was evaluated and compared against a blanket (or un-patterned) barrier film assembly under comparable temperature and relative humidity conditions.

Example 1

A PEN substrate was coated on one surface with a plastic self-releasing protective film. The protective film was then cut out in selected areas to form a patterned mask of windows in the protective film where the material was removed to expose the substrate for each of these samples. A layer of polymer (e.g., TFE-SJ-001) having a nominal thickness of 4 micrometers was deposited on the surface of the composite substrate (including the windowed protective film) by bar coating using a metered roll. The composite substrate samples (including the windowed protective film with the layer of polymer applied) were then each cured by a bench top UV-LED lamp for 10 minutes at c.a. 50 mW/cm$^2$ in a N$^2$ atmosphere. After curing, the protective film was removed from each composite substrate, leaving behind the substrates coated with a patterned polymer at the windows where the protective film windows were cut out. A first barrier layer was then deposited on each composite substrate including the patterned polymer layer by DC sputtering a 40 nanometer thick layer of $Al_2O_3$. The composite samples were then observed to evaluate the size and quality of the seal created between the various layers with an optical microscope in reflection mode.

The resulting isolated polymer areas for each 8-inch square sample substrate were approximately 5 cm by 2.5 cm. For the sample with a PEN substrate, the quality of the edge seal created around the polymer layer was good, with a greater resulting edge size ranging from 500 to 700 micrometers than the counterpart PEN/oxide samples due to better wettability of the polymer on the PEN surface directly. However, corners of the edge seal around the polymer layer showed signs of damage likely resulting from where the cuts used to create the mask (cutting windows out of the already-applied protective film) were too deep and undercut the substrate as well.

Example 2

A PEN/oxide substrate was coated on one surface with a plastic self-releasing protective film. The protective film was then cut out in selected areas to form a patterned mask of windows in the protective film where the material was removed to expose the substrate. A layer of polymer (e.g., TFE-SJ-001) having a nominal thickness of 4 micrometers was deposited on the surface of the composite substrate (including the windowed protective film) by bar coating using a metered roll. The composite substrate samples (including the windowed protective film with the layer of polymer applied) were then each cured by a bench top UV-LED lamp for 10 minutes at c.a. 50 mW/cm$^2$ in a N$^2$ atmosphere. After curing, the protective film was removed from each composite substrate, leaving behind the substrates coated with a patterned polymer at the windows where the protective film windows were cut out. A first barrier layer was then deposited on each composite substrate including the patterned polymer layer by DC sputtering a 40 nanometer thick layer of $Al_2O_3$. The composite samples were then observed to evaluate the size and quality of the seal created between the various layers with an optical microscope in reflection mode.

The resulting isolated polymer areas for each 8-inch square sample substrate were approximately 5 cm by 2.5 cm. For the sample with a PEN/oxide substrate, the quality of the edge seal created around the polymer layer was also generally good, ranging from 80-100 micrometers. However, the polymer showed signs of leaking under the mask (windowed protective seal) due to bad adhesion between the protective film and substrate. Likely, the cuts used to create the mask (cutting windows out of the already-applied protective film) were too deep and undercut the substrate as well. Based upon both Examples 1 and 2, if the openings in the protective film are cut before attaching the film to the substrates, this may help to prevent undercutting the substrate and prevent the associated leaking of polymer. Good adhesion of the protective layer at the edges is required to prevent leaks of polymer under the mask. Finally, inferior wettability of the polymer on the substrate (i.e., in the PEN/oxide substrate example) helps to create a smaller sealing area.

Comparative Example 1

A first PEN substrate was coated on one surface with a first blanket (or unmasked) layer of $Al_2O_3$ having a thickness of approximately 40 nanometers (nm) using a sputtering method. The first layer of $Al_2O_3$ was then coated with a first masked or patterned polymer layer having a thickness of approximately 1 micrometer (μm) using a flash evaporation masking method. The processes of applying a blanket layer of $Al_2O_3$ via sputtering and a patterned layer of polymer via flash evaporation were then each repeated, such that a total of three alternating layers of the $Al_2O_3$ ("o") and two alternating layers of the polymer ("p") in between the layers of $Al_2O_3$ were coated onto the first surface of the PEN substrate. A Calcium (Ca) filter film was then deposited onto the PEN/o/p/o/p/o with a thickness of approximately 60 nm by a thermal evaporation method. The Ca sensor, in conjunction with a top barrier coat comprised of four alternative layers of the $Al_2O_3$ ("o") deposited by sputtering, and the patterned polymer ("p") deposited by flash evaporation, were configured to detect water permeation through the bottom layers or the side of the stack. Thus the overall assembly or patterned barrier film of the first sample consisted of the PEN substrate coated with o/p/o/p/o followed by Ca/o/p/o/p/o/p/o/p.

The first assembly was aged for 1000 hours at 85° C./85% RH (relative humidity). After 1000 hours of aging, the Ca layers of the first sample, each measuring at approximately 2 centimeters in width by 2 centimeters in length, did not appear to have any visible areas of degradation, indicating that there was very little permeation through the patterned barrier film or from the edges of the patterned polymer decoupling layers. The samples of the first assembly were then subjected to an additional 1000 hours of aging at 85° C./85% RH, and continued to display minimal to no visible areas of degradation.

As a comparative example, a second PEN substrate was coated on one surface with a first blanket (or unmasked) layer of $Al_2O_3$ having a thickness of approximately 40 nanometers (nm) using a sputtering method (same as the original sample). The first layer of $Al_2O_3$ was then coated with a first blanket (or unmasked) polymer layer having a thickness of approximately 1 micrometer (μm) using a flash evaporation masking method. The processes of applying a blanket layer of $Al_2O_3$ via sputtering and a blanket layer of polymer via flash evaporation were then each repeated, such that a total of four alternating layers of the $Al_2O_3$ ("o") and three alternating layers of the polymer ("p") in between the layers of $Al_2O_3$ were coated onto the first surface of the PEN substrate. A Ca filter film (as described above) was then deposited onto the PEN/o/p/o/p/o with a thickness of approximately 60 nm by a thermal evaporation method. The Ca sensor, in conjunction with a top barrier coat comprised of four alternative layers of the $Al_2O_3$ ("o") deposited by sputtering, and the blanket polymer ("p") deposited by flash evaporation, configured to detect water permeation through the bottom layers or the side of the second sample stack having no edge seal. Thus the overall assembly or patterned barrier film of the second sample consisted of the PEN substrate coated with o/p/o/p/o/p/o (all blanket layers) followed by Ca/o/p/o/p/o/p/o/p.

The second assembly was cut into samples having varying distances between the Ca layer and the edge of the o/p barrier layers (e.g., between 4.9 millimeters and 8.6 millimeters) and aged at for 544 hours at 40° C./90% RH, having an acceleration factor about 10 times less than that of the 85° C./85% RH used with the first assembly. The resulting second samples displayed signs of degradation of the Ca filter film and water permeation from the cut-lines where each of the samples were cut, including pinholes present on the surface of the Ca filter film. Though water permeation and degradation in these samples was not present at all of the edges or cut-lines of the second sample set, it is to be understood that further aging will result in full degradation of the Ca filter film. Further, signs of degradation were visible even in the samples having at least 8.6 millimeters between the edge and the Ca filter film. The second sample set also demonstrated that the amount oxidization or degradation of the Ca filter film is directly related to the proximity of the Ca filter film to the edge or cut-line of the sample: the closer the Ca filter film is to the cut or un-sealed edge, the higher the degradation or permeation of moisture through the barrier film.

While certain exemplary embodiments of the present invention have been illustrated and described, it is understood by those of ordinary skill in the art that certain modifications and changes can be made to the described embodiments without departing from the spirit and scope of the present invention.

What is claimed is:

1. A barrier film, comprising:
   a substrate;
   a first layer on the substrate, the first layer comprising a barrier layer;
   a second layer on the first layer, the second layer comprising a polymer decoupling or planarization layer; and
   a third layer on the second layer, the third layer comprising a barrier layer,
   wherein each of the first and third layers has an area greater than an area of the second layer such that the second layer is completely enclosed between the first and third layers defining an edge perimeter surrounding the second layer that is completely sealed between the first and third layers,
   wherein the first layer comprises a pattern such that the substrate includes multiple discrete areas of the first layer each spanning an area smaller than an area of the substrate and separated from each other by uncoated regions.

2. The barrier film of claim 1, wherein the second layer comprises a pattern, each individual portion of the pattern having an area smaller than an area of each of the first and third layers and being completely enclosed between the first and third layers, defining an edge perimeter surrounding each individual portion of the second layer that is completely sealed between the first and third layers.

3. The barrier film of claim 2, wherein the third layer comprises a pattern having a discrete area on the substrate, and wherein each discrete area of the first and/or third layer is greater than an area of each individual portion of the pattern of the second layer such that each individual portion of the pattern of the second layer is completely enclosed between the first and third layers.

4. The barrier film of claim 3, wherein the pattern of the second layer comprises a plurality of strips that are fully contained within the discrete area of each of the first and third layers such that the plurality of strips is completely enclosed between the discrete area of each of the first and third layers.

5. The barrier film of claim 1, wherein the substrate comprises a plastic or polymer material.

6. The barrier film of claim 1, wherein each of the first layer and the third layer spans an area less than or equal to an area of the substrate, and wherein the first layer and the third layer may span the same or different areas.

7. The barrier film of claim 1, wherein the third layer comprises a pattern such that the first layer and the substrate include multiple discrete areas of the third layer each spanning an area greater than an area of the second layer, and an area smaller than the area of the substrate, and wherein the multiple discrete areas of the first layer and the third layer may be coincident such that the uncoated regions separate the discrete areas comprising the first, second, and third layers from each other.

8. The barrier film of claim 1, wherein a material of the first and third layers comprises a metal, metal oxide, metal nitride, metal oxynitride, metal carbide, or metal oxyboride.

9. The barrier film of claim 1, wherein a material of the second layer comprises an organic polymer, inorganic polymer, organometallic polymer, hybrid organic/inorganic polymer system, or silicate.

10. The barrier film of claim 1, further comprising a fourth layer on the third layer, the fourth layer comprising a barrier layer, wherein the fourth layer has an area less than or equal to an area of the substrate or comprises a pattern such that the first layer, third layer, and substrate include multiple discrete areas of the fourth layer each spanning an area greater than an area of the second layer, and an area smaller than the area of the substrate.

11. The barrier film of claim 1, further comprising at least one dyad layer comprising a coupling of an additional layer of the third layer on an additional layer of the second layer, the at least one dyad layer being on the third layer such that at least two alternating second layers and at least two alternating third layers are on the first layer.

* * * * *